United States Patent
Watanabe et al.

(10) Patent No.: US 7,750,427 B2
(45) Date of Patent: Jul. 6, 2010

(54) SEMICONDUCTOR DEVICE AND A METHOD OF MANUFACTURING THE SAME

(75) Inventors: Kozo Watanabe, Tokyo (JP); Shoji Yoshida, Tokyo (JP); Masashi Sahara, Tokyo (JP); Shinichi Tanabe, Kodaira (JP); Takashi Hashimoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/349,348

(22) Filed: Jan. 6, 2009

(65) Prior Publication Data

US 2009/0152644 A1 Jun. 18, 2009

Related U.S. Application Data

(62) Division of application No. 11/723,344, filed on Mar. 19, 2007, now Pat. No. 7,504,297.

(30) Foreign Application Priority Data

Apr. 20, 2006 (JP) .............................. 2006-116309

(51) Int. Cl.
*H01L 27/095* (2006.01)
(52) U.S. Cl. .............................. 257/478; 257/E29.148
(58) Field of Classification Search ................ 438/200, 438/207, 210, 237, 197; 257/499, 516, 528, 257/536, 379, 380, 382, 383, 384, 374, 155, 257/260, 267, 478, E29.148, E29.338, E21.064, 257/E21.351
See application file for complete search history.

(56) References Cited

U.S. PATENT DOCUMENTS

| 6,730,554 | B1 | 5/2004 | Baldwin et al. |
| 2004/0124477 | A1 | 7/2004 | Minami et al. |
| 2007/0001193 | A1* | 1/2007 | Drobny et al. ............... 257/107 |

FOREIGN PATENT DOCUMENTS

| JP | 5-235288 | | 9/1993 |
| JP | 2000-133802 | | 5/2000 |
| JP | 2001168352 A | * | 6/2001 |

* cited by examiner

*Primary Examiner*—Sue Purvis
*Assistant Examiner*—Selim Ahmed
(74) *Attorney, Agent, or Firm*—Miles & Stockbridge P.C.

(57) ABSTRACT

A technology is provided where a high performance Schottky-barrier diode and other semiconductor elements can be formed in the same chip controlling the increase in the number of steps. After a silicon oxide film is deposited over a substrate where an n-channel type MISFET is formed and the silicon oxide film over a gate electrode and $n^+$ type semiconductor region is selectively removed, a Co film is deposited over the substrate and a $CoSi_2$ layer is formed over the $n^+$ type semiconductor region and the gate electrode by applying a heat treatment to the substrate. After a silicon nitride film is deposited over the substrate and an aperture reaching the substrate is formed by removing the silicon nitride film and the silicon oxide film at the anode formation part of the Schottky barrier diode, a Ti film is deposited over the substrate including the inside of the aperture, and a $TiSi_2$ layer which becomes an anode electrode of the Schottky-barrier diode is formed at the bottom of the aperture by applying a heat treatment to the substrate.

18 Claims, 20 Drawing Sheets

SEMICONDUCTOR DEVICE AND A METHOD OF MANUFACTURING THE SAME

CROSS-REFERENCE TO RELATED APPLICATIONS

This application is a division of application Ser. No. 11/723,344, filed Mar. 19, 2007 now U.S. Pat. No. 7,504,297. This application also claims priority from Japanese patent application No. 2006-116309 filed Apr. 20, 2006, the content of which is hereby incorporated by reference into this application.

BACKGROUND OF THE INVENTION

The present invention relates to a semiconductor device and a manufacturing method thereof and, specifically, relates to an effective technology for a manufacturing method of a semiconductor device including a diode and other semiconductor elements formed over the same semiconductor substrate.

Japanese Unexamined Patent Publication No. Hei 5 (1993)-235288 (Patent document 1) discloses an example in which different kinds of silicide layers are formed over a gate electrode and the Schottky-diode formation region of a MOS transistor; a tungsten silicide layer is formed over the gate electrode of the MOS transistor; and a silicide layer including platinum and silicon is formed at the Schottky-diode formation region.

Japanese Unexamined Patent Publication No. 2000-133802 (Patent document 2) discloses an example in which different kinds of silicide films are formed over the source/drain and the gate electrode of a transistor; a cobalt silicide film is formed over the source/drain; and a titanium silicide layer is formed over the gate electrode.

SUMMARY OF THE INVENTION

An electronic tag has an advantage that higher density data can be stored therein compared with a tag using a bar code because data is stored in a memory circuit in a semiconductor chip (hereinafter, it is simply called a chip). Data stored in a memory circuit also have the advantage that illegal alteration is difficult to do compared with data stored in a bar code.

An electronic tag is one where desired data are stored in a memory circuit in a chip and data are read by using microwaves, and it has a structure where a chip is mounted on an antenna consisting of a lead frame.

Circuits such as rectification/transmission, clock extraction, selector, and counter are formed on a chip besides the memory circuit. The present inventors discovered the following problems in forming a Schottky-barrier diode included in these circuits.

Specifically, the aforementioned Schottky-barrier diode utilizes a metallic silicide film formation step in a process for forming a MISFET (Metal Insulator Semiconductor Field Effect Transistor) in the aforementioned circuit and a Schottky electrode is formed by using the metallic silicide film. This metallic silicide film is formed for the purpose of decreasing the resistivity of the gate electrode and the source/drain region in the MISFET. Moreover, since the increase in resistance is great in a titanium silicide film using Ti (titanium) caused by the effect of filamentation, a cobalt silicide film using Co (cobalt) has been formed instead of Ti corresponding to making the semiconductor element finer.

A Schottky-barrier diode where a Schottky electrode is formed by using a cobalt silicide film has a lower Schottky-barrier than a Schottky-barrier diode where a Schottky electrode is formed by using a titanium silicide layer, so that it has the problem that it is relatively inferior in the Schottky-barrier diode characteristics.

Moreover, when a back voltage is applied thereto, a leakage is easily generated in a Schottky-barrier diode where a Schottky electrode is formed by using a cobalt silicide film. For instance, if a guard ring is provided for preventing this leakage, the increase in the parasitic capacitance in this guard ring brings the increase in impedance. As a result, a problem arises that the Schottky-barrier diode characteristics decrease.

Moreover, since a cobalt silicide film which is optimized for the step of forming a MISFET has a thinner film thickness, a lower semiconductor substrate (hereinafter, it is simply called a substrate) is easily exposed by cutting while sputter etching in a subsequent process. In the case when the following steps are executed under a condition of exposing the substrate, a defect is created in which a leakage is generated when a back voltage is applied to the Schottky-barrier diode.

There is a means to form a Schottky electrode by forming an aperture reaching the substrate in the Schottky-barrier diode formation region while forming a contact hole reaching the gate electrode and the source/drain region of the MISFET in the following steps and forming a titanium silicide film at the aperture without forming a cobalt silicide film at the same time in the MISFET formation region and the Schottky-barrier diode formation region. However, since the aforementioned aperture for forming the Schottky electrode is larger than the other contact holes, a defect is created in which burying an aperture having a relatively larger opening diameter with a metallic film becomes difficult when a plug or an interconnection is formed by burying this contact hole and aperture with a metallic film. Moreover, a defect is created in which the flatness of the interconnection layer is prevented because burying the metallic film becomes difficult.

By the way, except for a means for forming a Schottky electrode composed of a metallic silicide film, there is a means where a metallic film (for instance, W (tungsten)) is deposited over a substrate after forming a MISFET and a Schottky electrode is formed by pattering the metallic film using an etching technique. However, since a gate electrode is already formed over the substrate, a step is created at the gate electrode formation part, so that there is a possibility that an etching trace of the metallic film remains at the step part. Moreover, in the case when an etching stopper film is formed below the metallic film to form a contact hole by a so-called SAC (Self Align Contact) processing, there is a possibility that there may be damage to the etching stopper film while patterning the metallic film. Therefore, a defect is created which makes the SAC processing difficult.

It is an objective of the present invention to provide a technology which can form a high performance Schottky-barrier diode and other semiconductor elements in the same chip as well as suppressing the number of process steps.

The aforementioned and other objectives and new features will appear from the following description and the accompanying drawings of this specification.

The outline of a typical one among the inventions disclosed in this application will be briefly described as follows.

A semiconductor device developed in the present invention includes: a MISFET which has a source region and a drain region formed in a first region over the main surface of a semiconductor substrate including silicon as a main component and a gate electrode including silicon as a main composition; and a Schottky-barrier diode which has a first electrode and a second electrode formed in a second region over the main surface of the semiconductor substrate, in which a first metallic compound layer including silicon and a first metal is formed over the surface of the source region, the drain region, and the gate electrode, in which the first electrode is formed of the first metallic compound layer, the second electrode is formed of a second metallic compound layer including the silicon and a second metal, and the second metallic compound layer has a lower Schottky-barrier than the case where the second electrode is formed with the first metallic compound layer.

Moreover, a manufacturing method of a semiconductor device in the present invention includes the steps of; (a) forming an isolation region over the main surface of a semiconductor substrate including silicon as a main component; (b) depositing a first conductive film mainly including silicon as a main component over the main surface of the semiconductor substrate and forming a gate electrode of a MISFET in a first region over the main surface of the semiconductor substrate by patterning the first conductive film; (c) forming a first semiconductor region in the semiconductor substrate at both sides of the gate electrode by selectively introducing a first impurity to the main surface of the semiconductor substrate, and forming a second semiconductor region in a second region of the semiconductor substrate; (d) forming a second insulation film over the semiconductor substrate and selectively removing the second insulation film over the gate electrode, the first semiconductor region, and the second semiconductor region;(e) depositing a first metallic film including a first metal as a main component over the semiconductor substrate in the presence of the second insulation film, forming a first metallic compound layer including silicon and the first metal over the gate electrode, the first semiconductor region, and the second semiconductor region by applying a first heat treatment to the semiconductor substrate, and removing the remaining first metallic film, (f) after the step (e), forming a third insulation film having a selective etching rate different from the isolation region over the semiconductor substrate and forming a first aperture reaching the semiconductor substrate by selectively removing the third insulation film at a different position from over the second semiconductor region in the second region over the main surface of the semiconductor substrate; (g) depositing a second metallic film including a second metal as a main component over the semiconductor substrate in the presence of the third insulation film, forming a second metallic compound layer including silicon and the second metal over the semiconductor substrate at the bottom part of the first aperture, and removing the remaining second metallic film; (h) after the step (g), forming a first insulation film having a selective etching rate different from the third insulation film over the semiconductor substrate; (i) forming a second aperture reaching the first metallic compound layer over the first semiconductor region, a third aperture reaching the first metallic compound layer over the gate electrode, a fourth aperture reaching the first metallic compound layer over the second semiconductor region, and a fifth aperture reaching the second metallic compound layer by selectively etching the first insulation film and the third insulation film; and (j) burying the second aperture, the third aperture, the fourth aperture, and the fifth aperture with a second conductive film to form a plug, in which the first semiconductor region forms a source region and a drain region of the MISFET, and the first metallic compound layer and the second metallic compound layer in the second region forms a first electrode and a second electrode of a Schottky-barrier diode, respectively.

Furthermore, a manufacturing method of a semiconductor device in the present invention includes the steps of: (a) forming an isolation region over the main surface of a semiconductor substrate including of silicon as a main component; (b) depositing a first conductive film including silicon as a main component over the main surface of the semiconductor substrate, forming a gate electrode of a MISFET in a first region over the main surface of the semiconductor substrate by patterning the first conductive film, and forming a resistive element in a third region over the main surface of the semiconductor substrate; (c) forming a first semiconductor region in the semiconductor substrate at both sides of the gate electrode by selectively introducing a first impurity to the main surface of the semiconductor substrate and forming a second semiconductor region in a second region of the semiconductor substrate; (d) forming a second insulation film over the semiconductor substrate and selectively removing the second insulation film over the gate electrode, the resistive element, the first semiconductor region, and the second semiconductor region; (e) depositing a first metallic film including a first metal as a main component over the semiconductor substrate in the presence of the second insulation film, forming a first metallic compound layer including silicon and the first metal over the gate electrode, the resistive element, the first semiconductor region, and the second semiconductor region by applying a first heat treatment to the semiconductor substrate, and removing the remaining first metallic film; (f) after the step (e), forming a third insulation film having a selective etching rate different from the aforementioned element isolation region over the semiconductor substrate and forming a first aperture reaching the semiconductor substrate by selectively removing the third insulation film at a different position from over the second semiconductor region in the second region over the main surface of the semiconductor substrate; (g) depositing a second metallic film including a second metal as a main component over the semiconductor substrate in the presence of the third insulation film, forming a second metallic compound layer including silicon and the second metal over the semiconductor substrate at the bottom part of the first aperture, and removing the remaining second metallic film; (h) after the step (g), forming a first insulation film having a selective etching rate different from the third insulation film over the semiconductor substrate; (i) forming a second aperture reaching the first metallic compound layer over the first semiconductor region, a third aperture reaching the first metallic compound layer over the gate electrode, a fourth aperture reaching the first metallic compound layer over the second semiconductor region, a fifth aperture reaching the second metallic compound layer, and a sixth aperture reaching the first metallic compound layer over the resistive element by selectively etching the first insulation film and the third insulation film; and (j) burying the second aperture, the third aperture, the fourth aperture, the fifth aperture, and the sixth aperture with a second conductive film to form a plug, in which the first semiconductor region forms a source region and a drain region of the MISFET, and the first metallic compound layer and the second metallic compound layer in the second region forms a first electrode and a second electrode of a Schottky-barrier diode, respectively.

Among the inventions disclosed in this application the effects obtained by a typical one will be briefly described as follows.

A high performance Schottky-barrier diode and other semiconductor elements such as a MISFET can be formed in the same chip as well as suppressing the number of process steps.

DETAILED DESCRIPTION OF THE PREFERRED EMBODIMENTS

Figure 1:
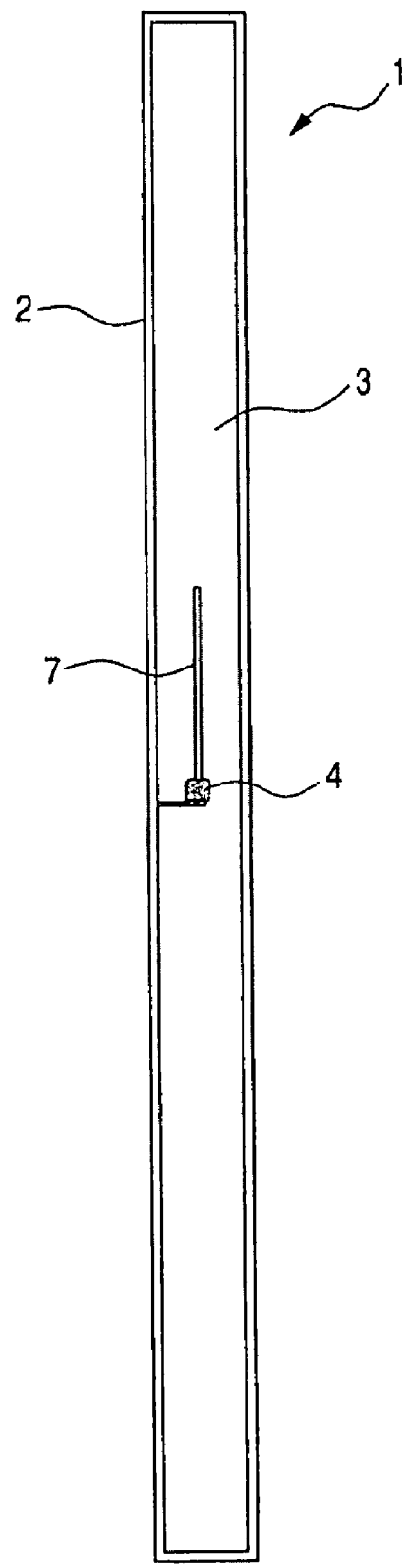
FIG. 1 is a plan view (surface side) illustrating an inlet for an electronic tag which is a semiconductor device of an embodiment in the present invention.

The meaning of the terms in this application will be explained as follows before explaining the details of the present invention.

An electronic tag is a main electronic component of an RFID (Radio Frequency Identification) system and an EPC (Electronic Product Code) system. In general, it is one where electronic intelligence, a communication function, a data rewrite function are delivered in a chip with a size of several millimeters or less (including cases larger than this) and it communicates with a reader by using electric waves and electromagnetic waves. It is called a radio tag or an IC tag, and higher grade, more complex data processing compared with a bar code becomes possible by attaching it on a product. There is a tag which does not have a battery and can be used semi-permanently because of non-contact power transport technology from an antenna (outside or inside of the chip). The tag has variety of shapes such as a level type, a card type, a coin type, and a stick type, etc. and one is selected from among them depending on the usage. The communication distance can be selected depending on the usage from one with several millimeters to one with several meters.

Inlet (Generally, it is a combination of an RFID chip and an antenna. However, there is one without an antenna or one which is integrated on a chip. Therefore, one without an antenna may be included in an inlet.) is a basic product form where an IC chip is mounted on a metallic coil (antenna) and the metallic coil and IC chip are generally unprotected, but they may be sealed in some cases.

In the following embodiments, the explanation will be carried out by dividing it into several sections or embodiments if it is necessary for convenience. However, except when especially specifying it, they are not irrelevant from each other and there is a relation where one is a modified example, detail, and amplification of one or all parts of another.

Moreover, in the case when the number of elements (including number, numerical value, amount, and range, etc.) is described in the following embodiments, it is not intended to be limited to the specific number except for the case when it is specifically clearly shown and fundamentally limited to an obvious specific number, and it is acceptable to select more or less than the specific number.

Moreover, in the following embodiments, it is needless to say in the following embodiments that the component (including an element step, etc.) is not necessarily indispensable, except when it is specifically pointed out explicitly and is considered to be obviously indispensable fundamentally. Furthermore, when the component etc. is described "made of A" and "consists of A" in the embodiment etc., it is needless to say that it does not exclude any other elements except when it is pointed out explicitly that it is only the specific element.

Similarly, when the shape of a component, etc. and position, etc. are described in the following embodiment, one which is substantially approximate or similar to the shape etc. is included except when it is specifically pointed out explicitly and it is considered not to be obviously so fundamentally. The above-mentioned matters are similar to the aforementioned numerical value and the range.

Moreover, when a material, etc. is described, the specified material is a major material and it is needless to say that it does not exclude any secondary elements, additives, and any added elements, etc. except when it is clearly described that it is not so or it is fundamentally or circumstantially not so. For instance, a silicon component is assumed to include not only pure silicon but also added impurities, binary or ternary alloys, etc. (for instance SiGe) including silicon as a main component, except when it is clearly described.

Moreover, in all figures to explain the embodiments of the present invention, the same code is essentially given to one having the same function and the repetition of the explanation will be omitted.

Moreover, in the drawings used in the embodiments, hatching might be partially used to make the drawing easy to see even if it is a plan view.

Hereinafter, the embodiments of this invention will be described in detail by referring to the drawings.

First Embodiment

Figure 2:
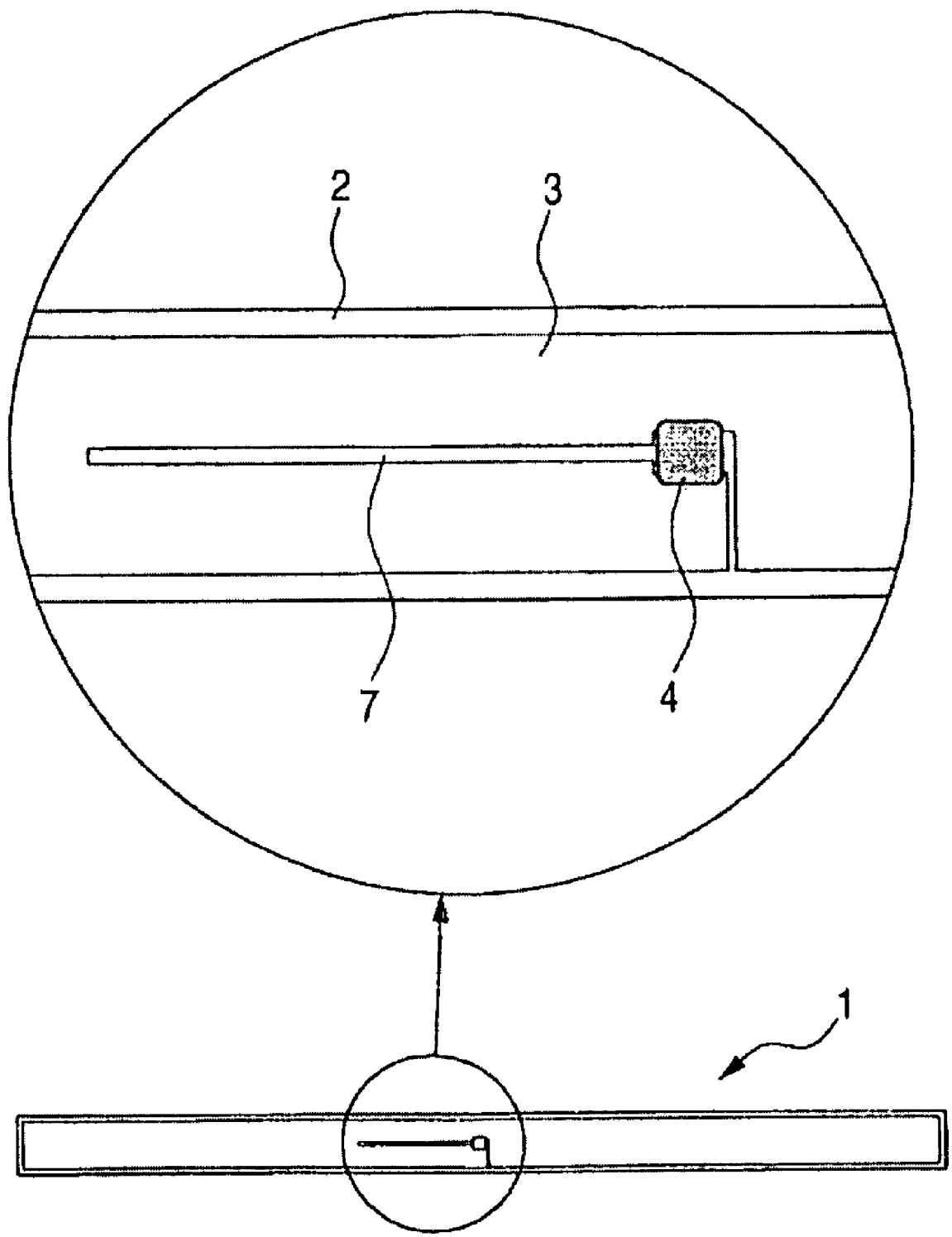
FIG. 2 is an expanded plan view illustrating a part of FIG. 1.
Figure 3:
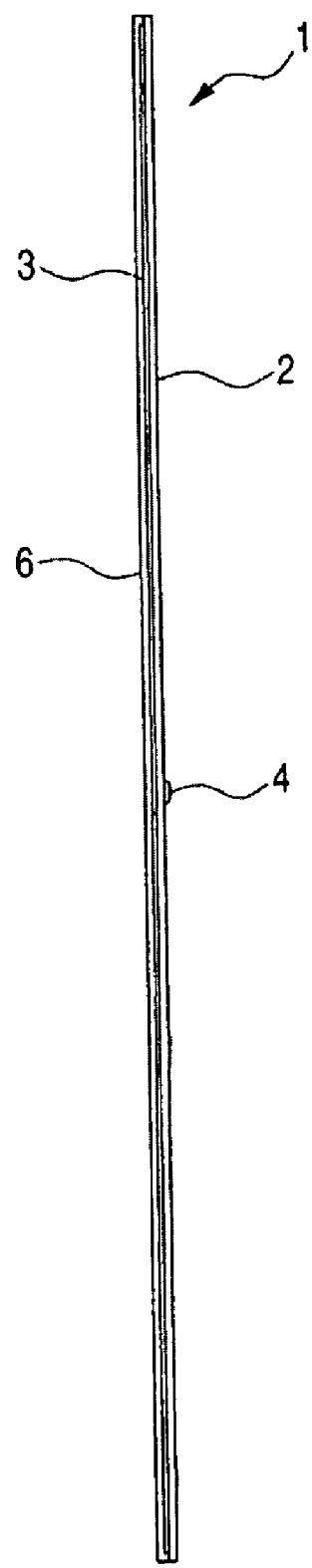
FIG. 3 is a side view illustrating an inlet for an electronic tag which is a semiconductor device of an embodiment in the present invention.
Figure 4:
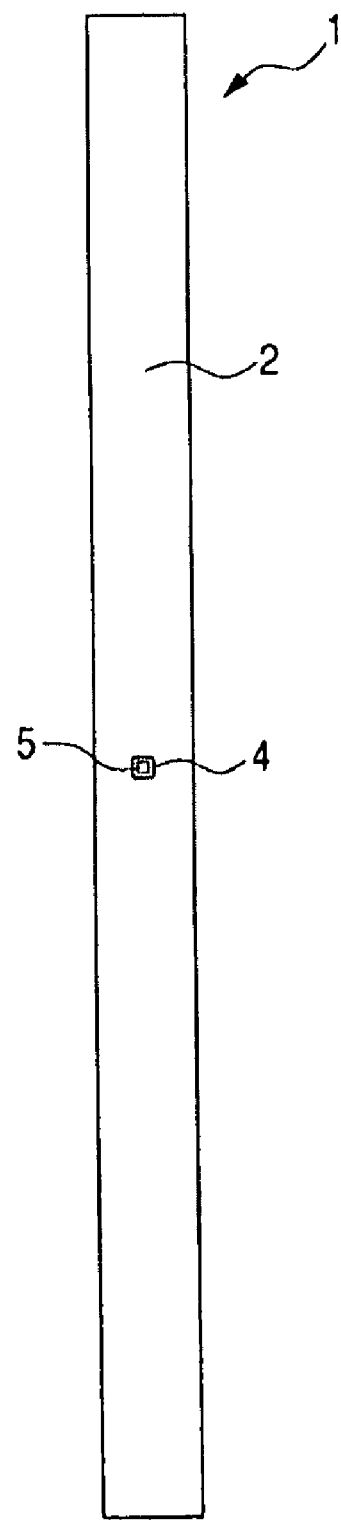
FIG. 4 is a plan view (rear side) illustrating an inlet for an electronic tag which is a semiconductor device of an embodiment in the present invention.
Figure 5:
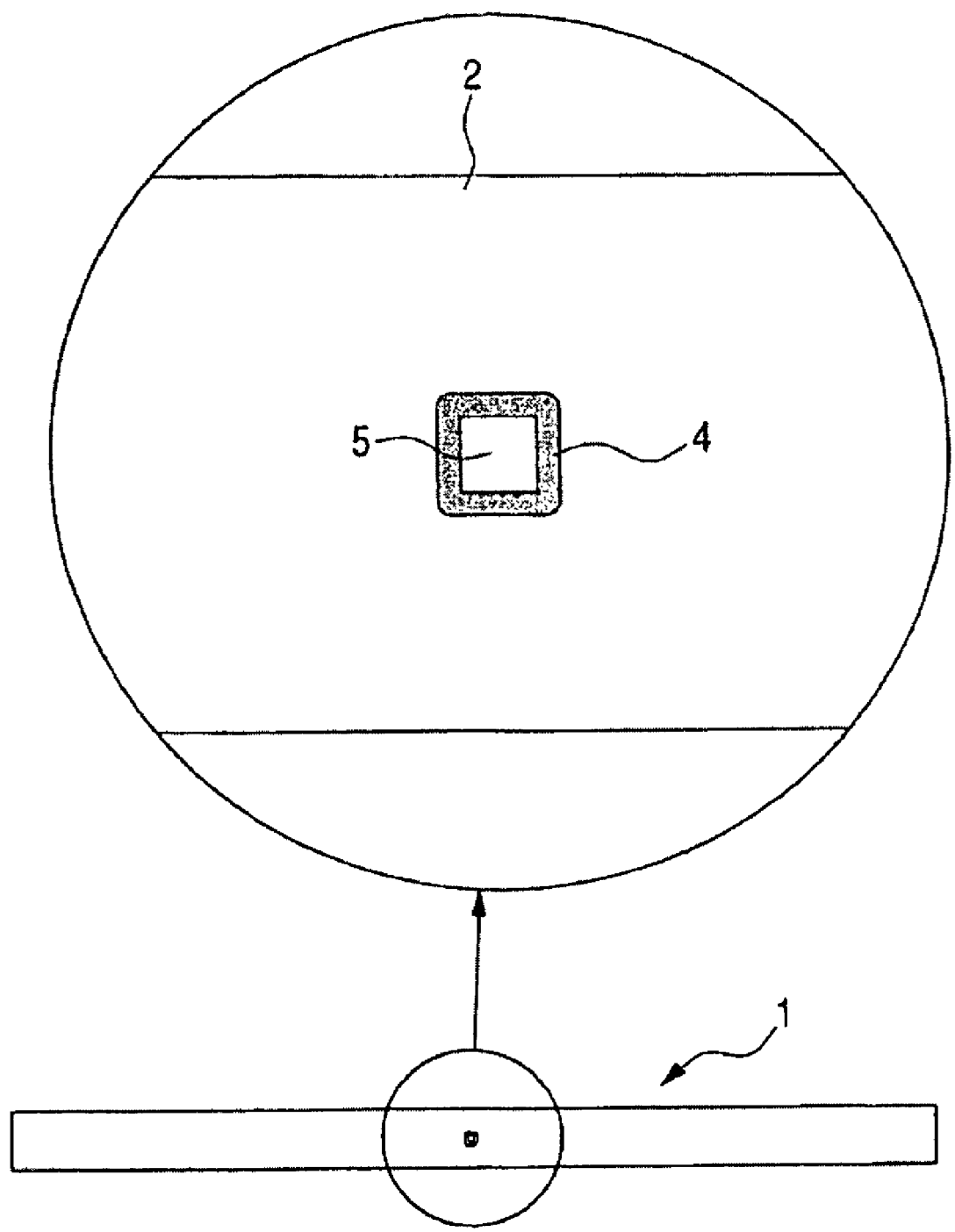
FIG. 5 is an expanded plan view illustrating a part of FIG. 4.

FIG. 1 is a plan view illustrating an inlet for an electronic tag which is a semiconductor device of this embodiment; FIG. 2 is an enlarged plan view illustrating a part of FIG. 1; FIG. 3 is a side view illustrating an inlet for an electronic tag of this embodiment; FIG. 4 is a plan view (rear side) illustrating an inlet for an electronic tag of this embodiment; and FIG. 5 is an enlarged plan view illustrating a part of FIG. 4. As described above, a part or all of the embodiments (embodiment) is a part or all of the following embodiments. Therefore, as a rule, the explanation is omitted in the overlapping parts. An inlet for an electronic tag (hereinafter, it is called an inlet) 1 of this embodiment is composed of a main part of a contactless electronic tag comprising an antenna for microwave reception. This inlet includes an antenna 3 having an Al foil bonded over one surface of a long slender rectangular insulation film 2 and a chip 5 bonded to the antenna 3 under the condition where the surface and the side faces are sealed with a potting resin 4. On one surface of the insulation film 2 (the face on which the antenna 3 is formed), a cover film 6 is laminated for protecting the antenna 3 and the chip 5, as necessary.

The length of the antenna 3 along the long side of the aforementioned insulation film 2 is, for instance, 56 mm, and it is optimized to receive microwaves of a frequency of 2.45 GHz efficiently. Moreover, the width of the antenna 3 is 3 mm and it is optimized to make the miniaturization of the inlet 1 compatible with securing the strength.

An L-shaped slit 7 where one end reaches the outside edge of antenna 3 is formed at the almost center part of the antenna 3, and a chip 5 sealed with the potting resin 4 is mounted on a part midway in this slit 7.

Figure 6:
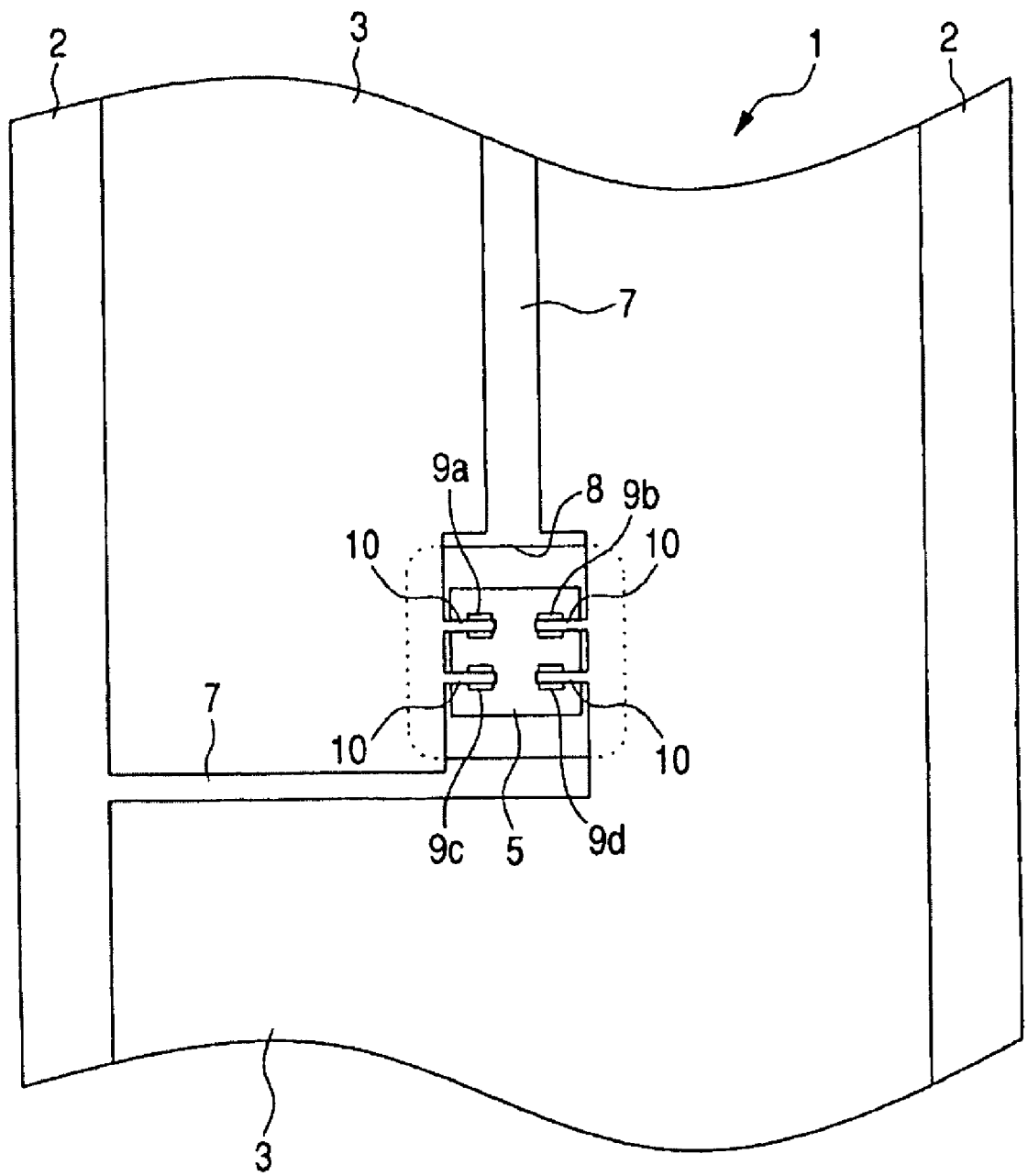
FIG. 6 is an expanded plan view (surface side) illustrating the main part of an inlet for an electronic tag which is a semiconductor device of an embodiment in the present invention.
Figure 7:
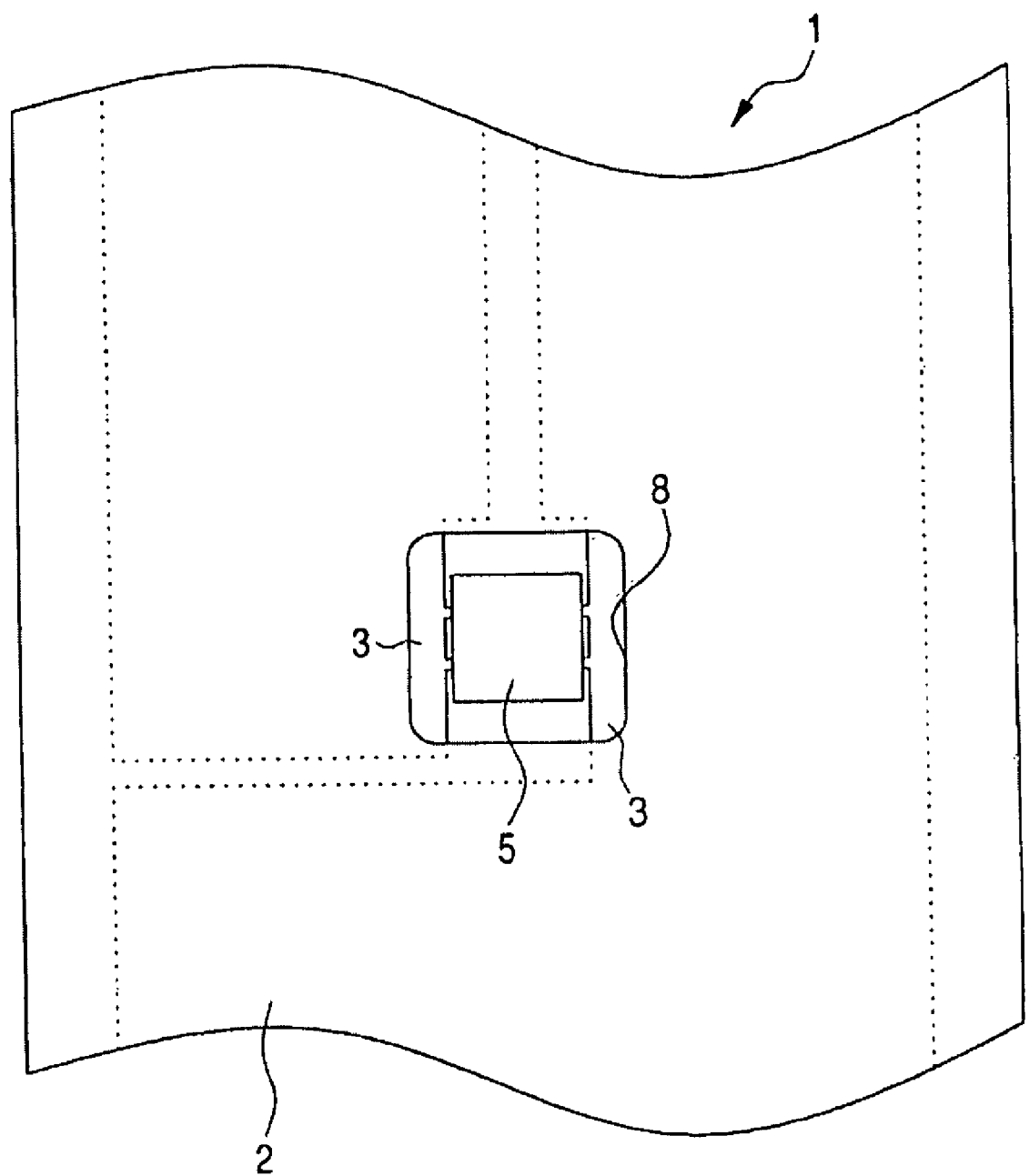
FIG. 7 is an expanded plan view (rear side) illustrating the main part of an inlet for an electronic tag which is a semiconductor device of an embodiment in the present invention.

FIG. 6 and FIG. 7 are enlarged plan view illustrating the region near the center part of the antenna 3 where the aforementioned slit 7 is formed. FIG. 6 and FIG. 7 show the surface side and the rear face side of the inlet 1, respectively. In these figures, illustrations of the potting resin 4 for sealing the chip 5 and the cover film 6 are omitted.

As shown in the figure, a device hole 8 is formed at the midway point of the slit 7 by punching a part of the insulation film 2, and the aforementioned chip 5 is arranged at the center of this device hole 8. The dimension of the device hole 8 is, for instance, length×width=0.8 mm×0.8 mm and the dimension of the chip 5 is length×width=0.48 mm×0.48 mm.

As shown in FIG. 6, for instance, four Au (gold) bumps 9a, 9b, 9c, and 9d are formed over the main surface of the chip 5. Moreover, leads 10 formed with the antenna 3 as one body where one end lies along the inside of the device hole 8 are connected to each of these Au bumps 9a, 9b, 9c, and 9d.

Two leads 10 among the aforementioned four leads 10 lie along the inside of the device hole 8 from one side of the antenna 3 which is divided into two by the slit 7, and they are electrically connected to the Au bumps 9a and 9c of the chip 5. Moreover, the remaining two leads 10 lie along the inside of the device hole 8 from another side of the antenna 3, and they are electrically connected to the Au bumps 9b and 9d of the chip 5.

Figure 8:
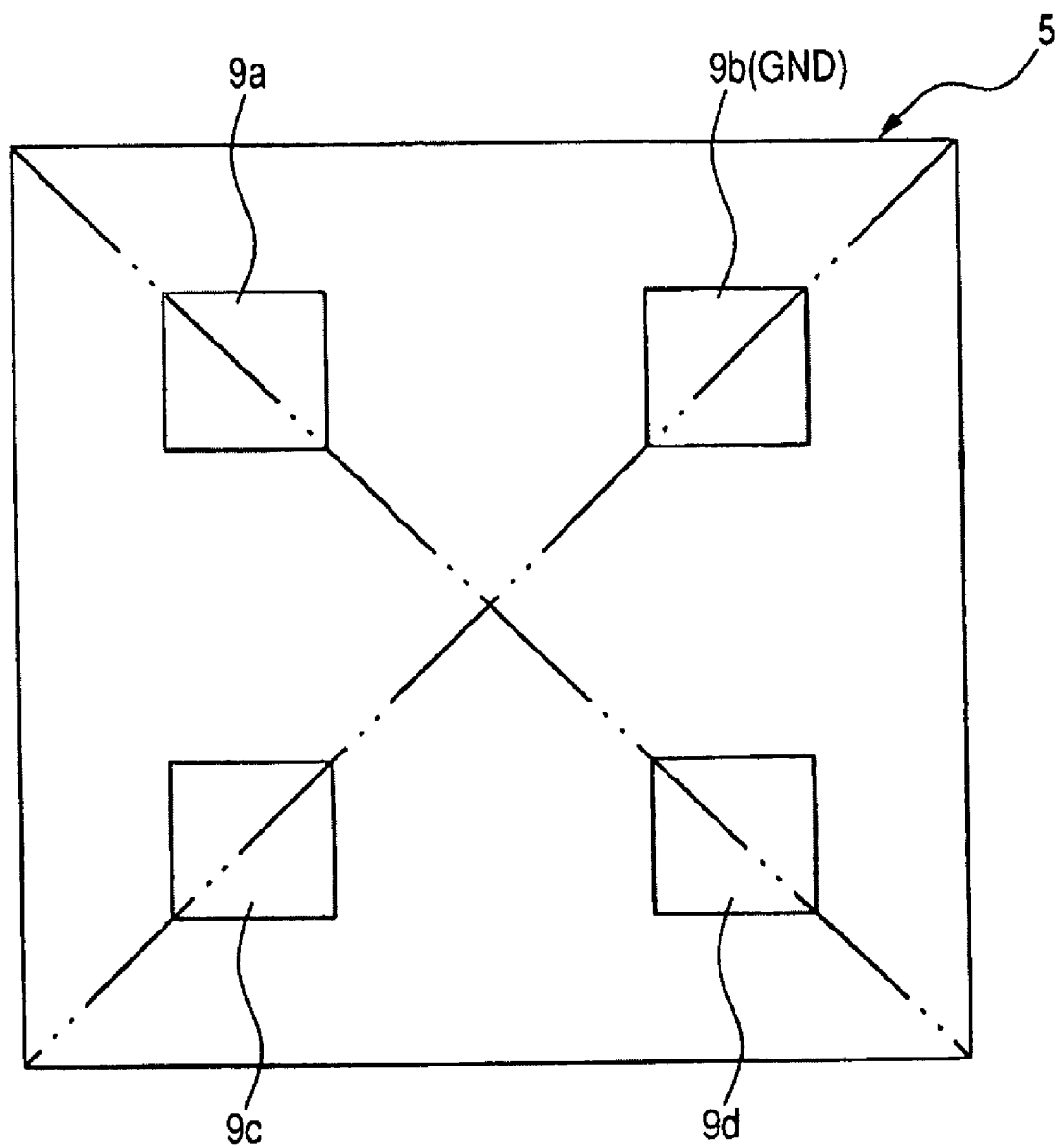
FIG. 8 is a plan view illustrating a semiconductor chip mounted in an inlet for an electronic tag which is a semiconductor device of an embodiment in the present invention.
Figure 9:
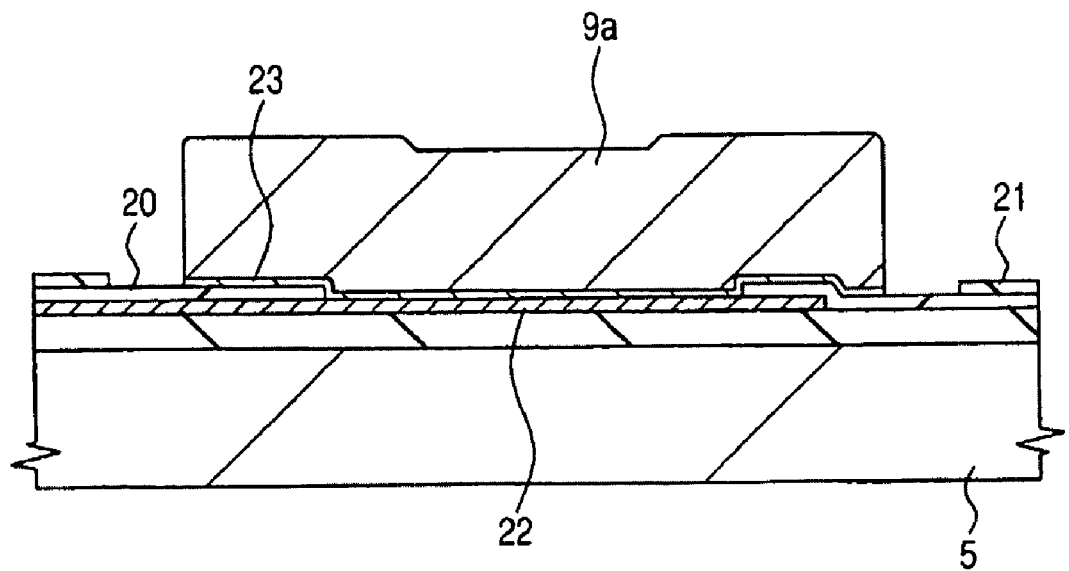
FIG. 9 is a cross-sectional view illustrating a bump electrode and the neighborhood thereof formed over the main surface of a semiconductor chip shown in FIG. 8.
Figure 10:
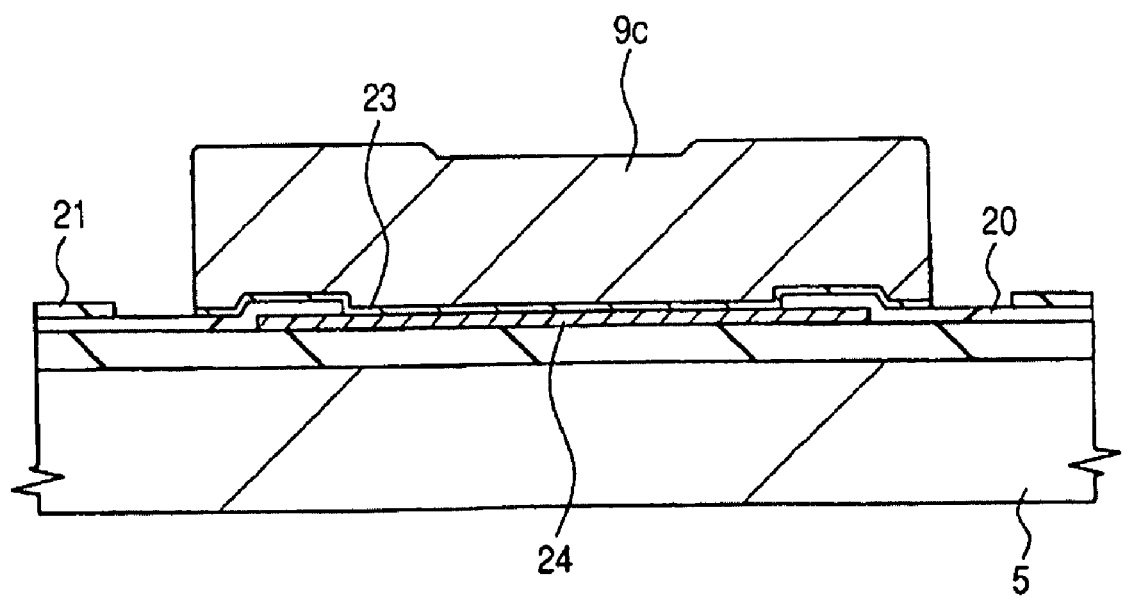
FIG. 10 is across-sectional view illustrating a dummy bump electrode and the neighborhood thereof formed over the main surface of a semiconductor chip shown in FIG. 8.

FIG. 8 is a plan view illustrating four Au bumps 9a, 9b, 9c, and 9d formed over the main surface of the aforementioned chip 5; FIG. 9 is an enlarged cross-sectional view illustrating the neighborhood of the Au bump 9a; FIG. 10 is an enlarged cross-sectional view illustrating the neighborhood of the Au bump 9c; and FIG. 11 is a block diagram illustrating a circuit formed on the chip 5.

Figure 11:
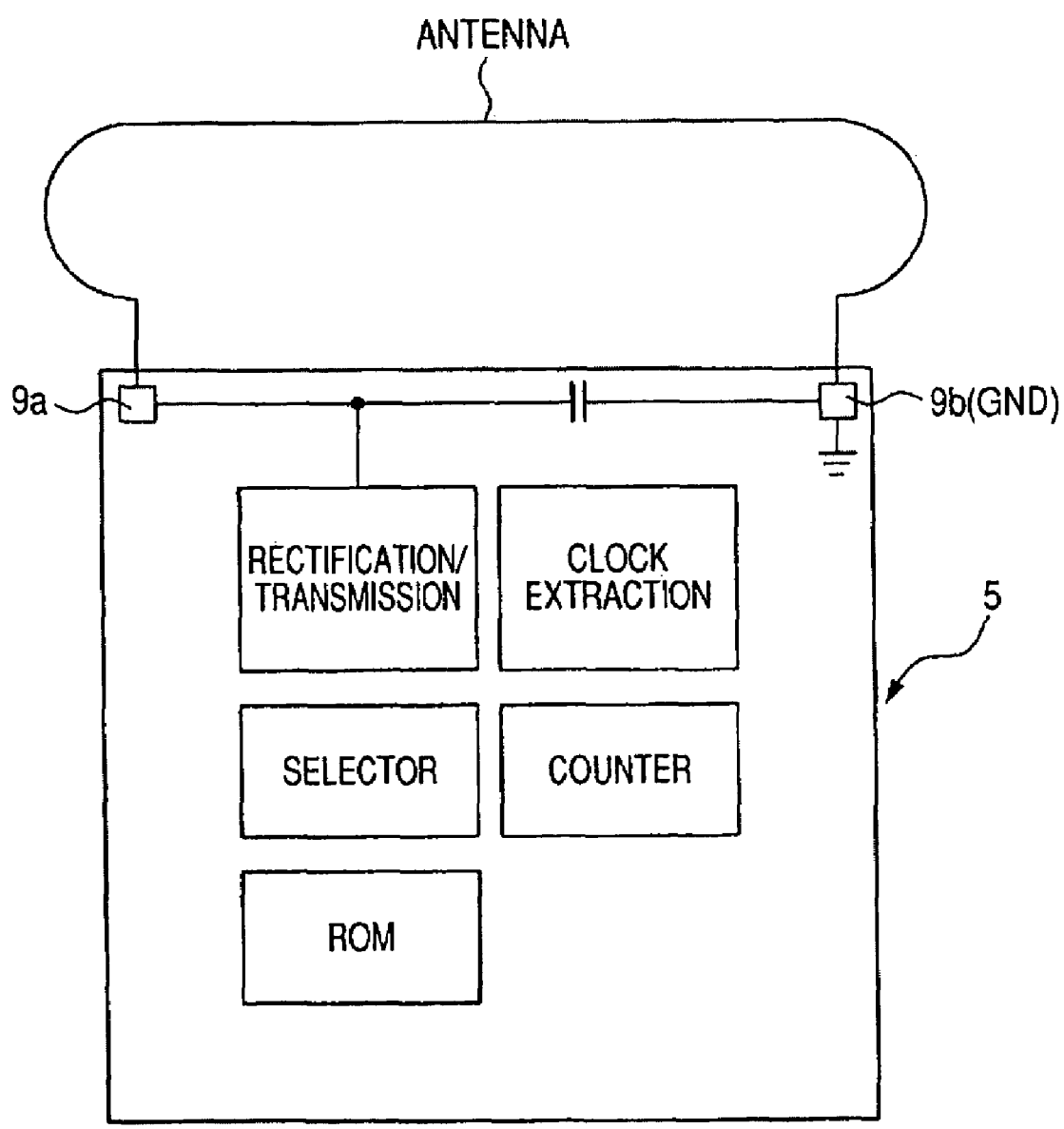
FIG. 11 is a block diagram illustrating a circuit for med over the main surface of a semiconductor chip shown in FIG. 8.

The chip 5 includes a single crystal silicon substrate with a thickness of about 0.15 mm and circuits which include rectification/transmission, clock extraction, selector, counter, and ROM, etc. are formed over the main surface as shown in FIG. 11. The ROM has a storage capacity of 128 bits and can store large capacity data compared with a storage medium such as a bar code. Moreover, there is an advantage that it is difficult to illegally falsify data stored in the ROM compared with data stored in a bar code.

Four Au bumps 9a, 9b, 9c, and 9d are formed over the main surface of the chip 5 where the aforementioned circuits are formed. These four Au bump 9a, 9b, 9c, and 9d are located on a pair of virtual kitty-corners shown as the two-dot chain lines in FIG. 8 and are laid out so as to make the distance from the intersection point of the diagonals (the center of the main surface of the chip 5) almost equal. These bumps 9a, 9b, 9c, and 9d are formed by using an electroplating technique and the height is about 15 μm, for instance.

The layout of these Au bumps 9a, 9b, 9c, and 9d are not limited to the layout shown in FIG. 8 but a layout is preferable in which a balance can be maintained with respect to an increase in weight while connecting the chip. For instance, in the plane layout, a polygon formed by the lines of intersection with the Au bumps is preferably arranged to enclose the center of the chip.

For instance, the Au bump 9a among the aforementioned four Au bumps 9a, 9b, 9c, and 9d consists of an input terminal of the circuit shown in the above-mentioned FIG. 11, and the Au bump 9b consists of a GND terminal. Moreover, the remaining two Au bumps 9c and 9d consist of dummy bumps which are not connected to the aforementioned circuit.

As shown in FIG. 9, Au bump 9a consisting of the input terminal of the circuit is formed over the uppermost metallic interconnection 22 which is exposed by etching the passivation film 20 and the polyimide resin 21 covering the main surface of the chip 5. Moreover, between the Au bump 9a and the uppermost metallic interconnection 22 a barrier metal film 23 is formed to improve the adhesion between these two. The passivation film 20 includes, for instance, a stacked film of a silicon oxide film and a silicon nitride film, and the uppermost metallic interconnection 22 includes, for instance, an Al alloy film. Moreover, the barrier metal film 23 consists of a stacked layer of, for instance, a Ti film which has excellent adhesion to the Al alloy film and a Pd film which has excellent adhesion to the Au bump 9a. Although not shown in the figure, a connection part of the Au bump 9b consisting of the GND terminal of the circuit and the uppermost metallic interconnection 22 have the same configuration as that above. On the other hand, as shown in FIG. 10, although the Au bump 9c (and 9d) constituting the dummy bump is connected to the metallic layer 24 which is formed in the same interconnection layer with the aforementioned uppermost metallic interconnection 22, this metallic layer 24 is not connected to the aforementioned circuit.

Thus, the inlet 1 of this embodiment includes the slit 7 where one end thereof reaches the outside edge of the antenna 3 at the one part of the antenna 3 formed over one face of the insulation film 2, and the input terminal (Au bump 9a) of the chip 5 is connected to one side of antenna 3 divided into two by this slit 7 and the GND terminal (Au bump 9b) is connected to another side. Since the effective length of the antenna 3 can be made longer according to this configuration, the size of the inlet 1 can be minimized while securing the necessary length of the antenna.

Moreover, the inlet 1 of this embodiment includes the Au bumps 9a and 9b constituting the terminals of the circuit and the dummy Au bumps 9c and 9d over the main surface of the chip 5, and these four Au bumps 9a, 9b, 9c, and 9d are connected to a lead 10 of the antenna 3. According to this configuration, the effective contact area between the Au bump and the lead 10 becomes larger compared to the case when only two Au bumps 9a and 9b connected to the circuit are connected to the lead 10, resulting in the bond strength between the Au bump and the lead 10, that is, connection reliability between both being improved. Moreover, the four Au bumps 9a, 9b, 9c, and 9d are arranged over the main surface of the chip 5 with the layout as shown in FIG. 8, thereby, the chip 5 never tilts relative to the insulation film 2 when the lead 10 is connected to the Au bumps 9a, 9b, 9c, and 9d. As a result, since the chip 5 can be securely sealed by the potting resin 4, the manufacturing yield of the inlet 1 is improved.

The aforementioned chip 5 includes a Schottky-barrier diode, a MISFET, and a resistor, etc. which composes the circuit shown in FIG. 11. A manufacturing method of these chips 5 will be explained referring to FIG. 12 to FIG. 21. These FIGS. 12 to 21 are cross-sectional views illustrating a region where a Schottky-barrier diode is formed (SBD formation region (second region), a region where a MISFET is formed (MISFET formation region (first region), and a region where a resistor (resistance element) is formed (resistance formation region (third region)). Moreover, an n-channel MISFET is formed in the MISFET region shown in FIG. 12 to FIG. 21.

Figure 12:
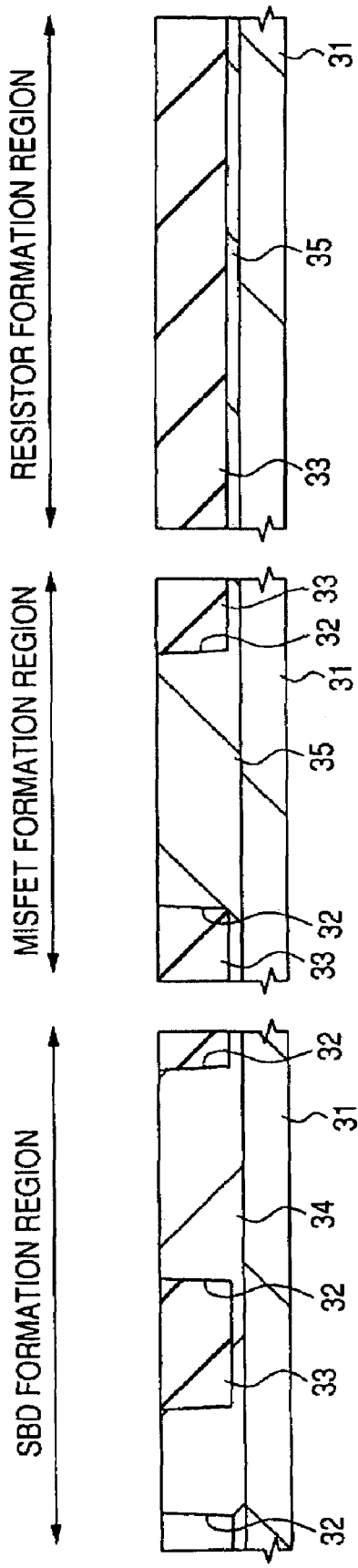
FIG. 12 is a cross-sectional view of the main parts illustrating a manufacturing method of a chip included in an electronic tag which is a semiconductor device of an embodiment in the present invention.

First of all, as shown in FIG. 12, an isolation region 32 is formed over the main surface (element formation surface) of a semiconductor substrate (hereinafter, it is simply written as substrate) 31. This element isolation region 32 is formed, for instance, as follows. First, a groove part is formed by etching the main surface of the substrate 31 composed of p-type single crystal silicon having a specific resistance of about 1 to 10Ωcm. Next, a thin silicon oxide film (not shown in the figure) is formed over the inside wall of the groove part by thermal oxidation of the substrate 31 at about 1000° C. This silicon oxide film is formed to relieve the stress created at the interface between the silicon oxide film, which buries the inside of the groove part in the next step, and the substrate 31 as well as to recover the damage of dry etching created inside the wall of the groove part. Then, a silicon oxide film 33 is deposited as an insulation film by using a CVD (Chemical Vapor deposition) technique over the substrate 31 including inside the groove part. Next, the silicon oxide film 33 at the top of the groove is polished by using a CMP (Chemical Mechanical Polishing) method, and a silicon oxide film 33 is left inside the groove, resulting in the isolation region 32 being formed.

Next, after an n-type conductive impurity (for instance, P (phosphorus)) and a p-type conductive impurity (for instance, B (boron)) are ion-injected into the substrate 31, impurities are diffused by applying a heat-treatment to the substrate 31, resulting in an n-type well 34 and a p-type well 35 in the substrate 31 being formed. At this time, on the substrate 31, active regions which is the main surface of the n-type well 34 and p-type well 35 are formed, and these active regions are enclosed by the aforementioned isolation region 32.

Figure 13:
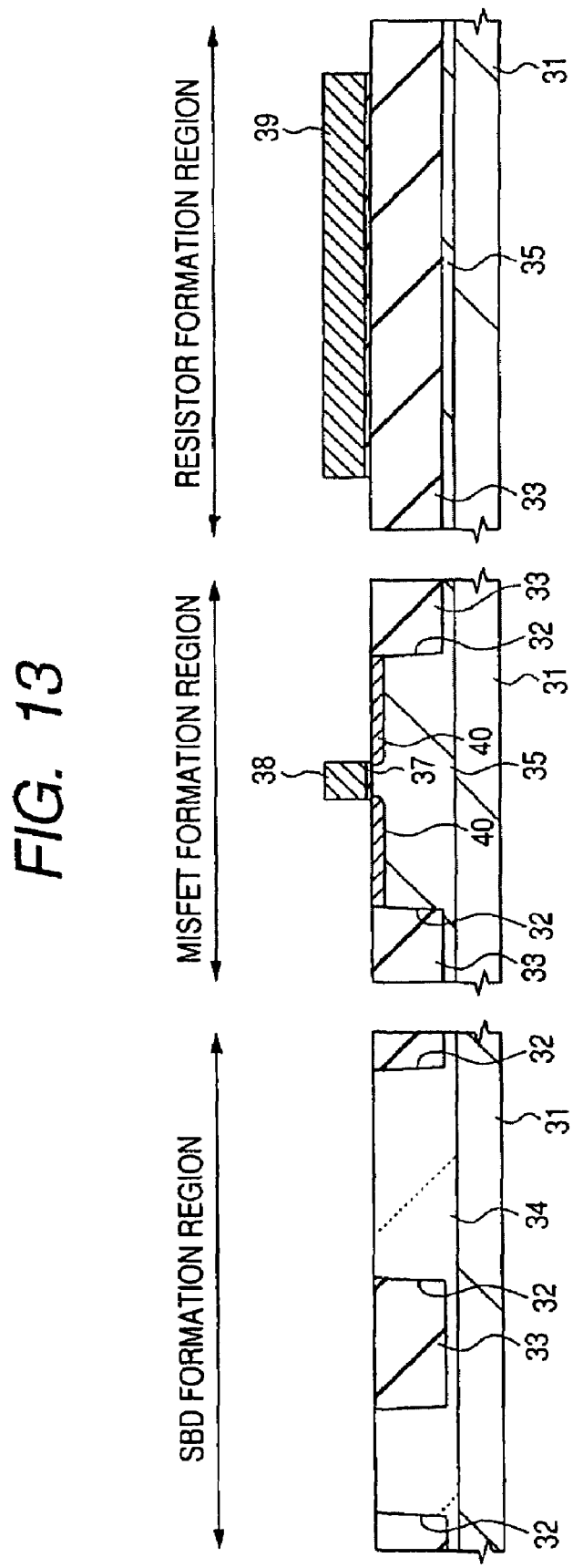
FIG. 13 is a cross-sectional view of the main parts in a manufacturing process of a chip following FIG. 12.

Next, as shown in FIG. 13, after the surface of the substrate 31 (n-type well 34 and the p-type well 35) is wet-etched by using a hydrofluoric acid system cleaning solution, a clean gate oxide film 37 working as the gate insulation film is formed over each surface of the n-type well 34 and the p-type well 35 by applying a heat treatment to the substrate 31.

Next, a low resistivity polycrystalline silicon film (first conductive film) with a thickness of about 100 nm is deposited as a conductive film over the substrate 31 by, for instance, a CVD technique. Next, by etching the polycrystalline silicon film using a photoresist film, which is patterned by using a photolithography technique, as a mask, a gate electrode 38 is formed in the MISFET formation region and a resistor 39 is formed in the resistance formation region.

An n-type conductive impurity (for instance, P or As (arsenic)) is introduced in the p-well 35 at both sides of the gate electrode 38 to form a low density n⁻type semiconductor region 40.

Figure 14:
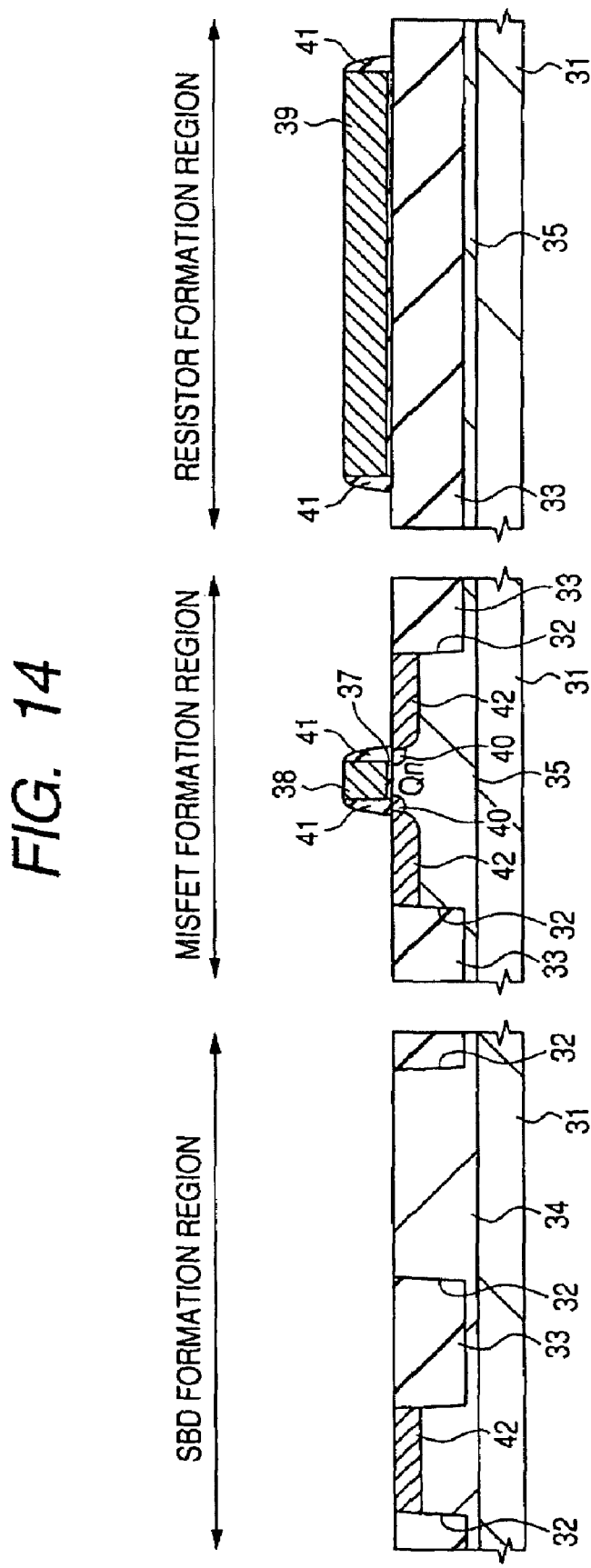
FIG. 14 is a cross-sectional view of the main parts in a manufacturing process of a chip following FIG. 13.

Next, as shown in FIG. 14, after a silicon oxide film is deposited over the substrate 31 by using a CVD technique, a side wall spacer 41 is formed at the sidewalls of the gate electrode 38 and the resistor 39 by isotropically etching this silicon oxide film using a reactive ion etching (RIE) technique. An n-type conductive impurity (first impurity (for instance, P or As)) is selectively injected into the p-well 35 of the MISFET formation region and the cathode formation region of the Schottky-barrier diode in the SBD formation region to form a high density n⁺ type semiconductor region (first semiconductor region and second semiconductor region) 42. As a result, an n-channel type MISFETQn including a source/drain which has an LDD (Lightly Doped Drain) structure can be formed in the MISFET formation region. In a region which is not shown in FIG. 14, a p-channel type MISFET may be formed. A p-channel type MISFET is formed as follows; after an n-well is formed by introducing an n-type conductive impurity (for instance, P) into the substrate 1 and applying a heat treatment thereto, and the gate electrode the same as the aforementioned gate electrode 38 is formed, a p-type semiconductor region (source and drain) is formed by injecting a p-type conductive impurity (for instance, B)) into the n-type well.

Figure 15:
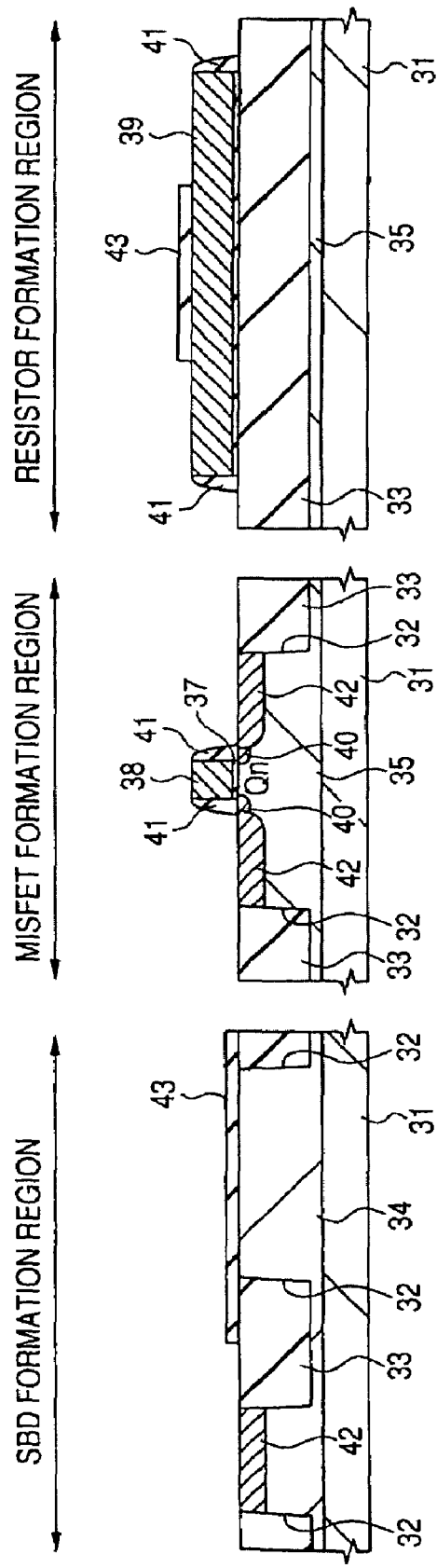
FIG. 15 is a cross-sectional view of the main parts in a manufacturing process of a chip following FIG. 14.

Next, as shown in FIG. 15, after about a 10 nm to 50 nm thick silicon oxide film (second insulation film) 43 is deposited over the substrate 1, the silicon oxide film 43 is etched using a photoresist film, which is patterned by using a photolithography technique, as a mask. Thereby, the silicon oxide film 43 over the gate electrode 38, the resistor 39, and the n⁺ type semiconductor region 42 is selectively removed. The silicon oxide film 43 at the region where the plug formed in the following step is connected to the resistor 39 is removed and another silicon oxide film 43 is left over the resister 39.

Figure 16:
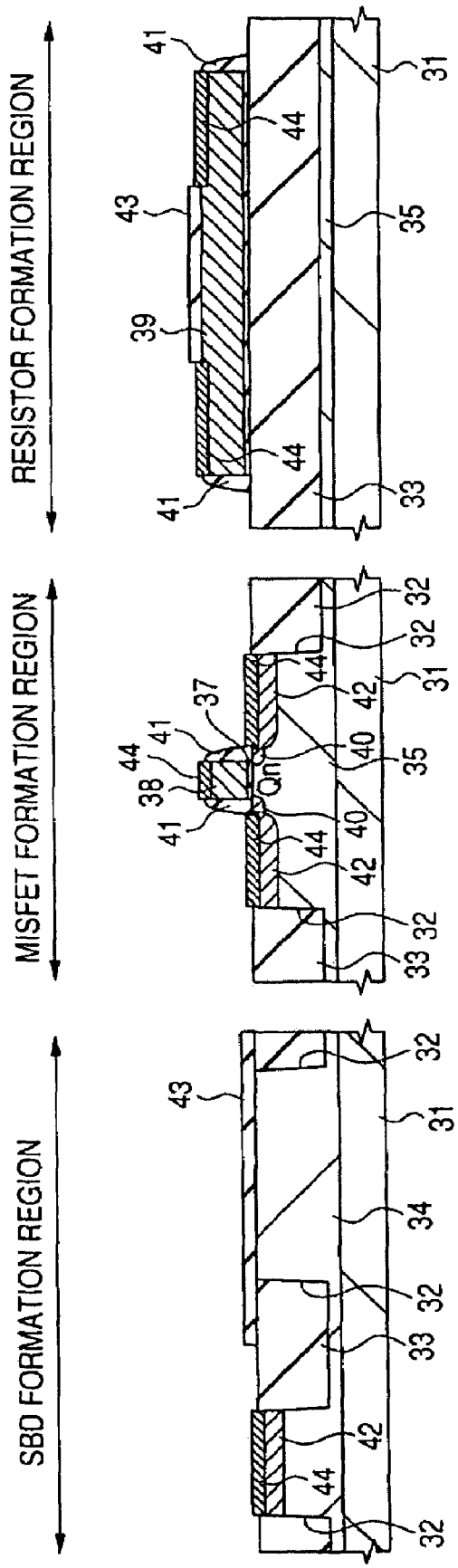
FIG. 16 is a cross-sectional view of the main parts in a manufacturing process of a chip following FIG. 15.

Next, as shown in FIG. 16, a Co (cobalt (first metal)) film (first metallic film) is deposited over the substrate 31 by a sputtering technique. Then, after a heat treatment (first heat treatment) is applied to the substrate 31, a roughly 25 nm to 30 nm thick $CoSi_2$ layer (first metallic compound layer) 44 is formed as a silicide layer over the n⁺ type semiconductor region 42, the gate electrode 38, and the resistor 39.

Figure 17:
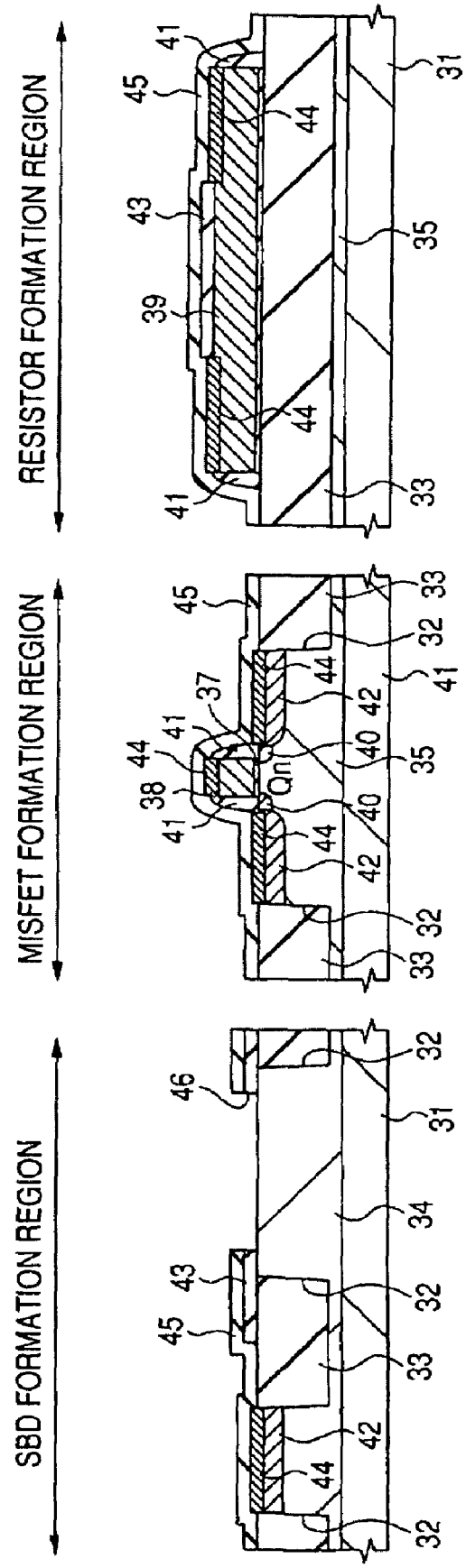
FIG. 17 is a cross-sectional view of the main parts in a manufacturing process of a chip following FIG. 16.

Next, after removing the unreacted Co film by etching, as shown in FIG. 17, for instance, a roughly 20 nm to 60 nm thick silicon nitride film (third insulation film) 45 is deposited over the substrate. After that, the silicon nitride film 45 and the silicon oxide film 43 at the anode formation part in the SBD formation region are etched using the photoresist film, which is patterned by using a photolithography technique, as a mask, resulting in an aperture (first aperture) 46 reaching the substrate 31 (n-type well 34) being formed.

Figure 18:
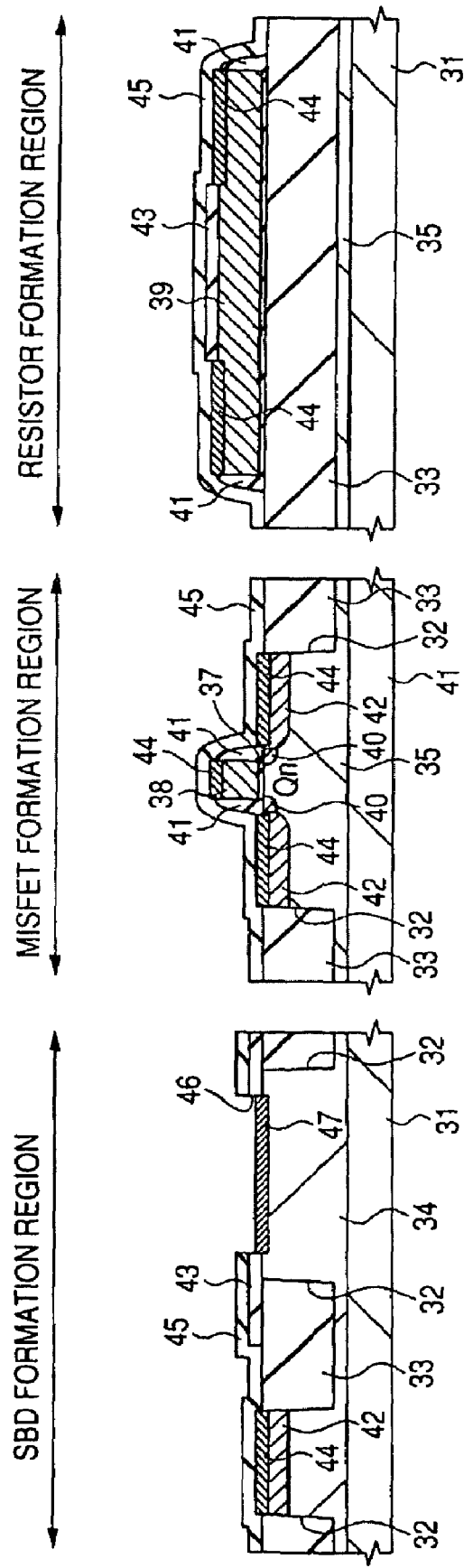
FIG. 18 is a cross-sectional view of the main parts in a manufacturing process of a chip following FIG. 17.

As shown in FIG. 18, a Ti (titanium (second metal)) film (second metallic film) is deposited by a sputtering technique over the substrate 31 which includes the aforementioned aperture 46. Next, a heat treatment (second heat treatment) is applied at a temperature (about 650° C. to 850° C.) at a level where $CoSi_2$ particles which form a $CoSi_2$ layer 44 do not agglomerate, and a roughly 50 nm thick TiSi$_2$ layer (second metallic compound layer) 47 is formed as a silicide layer at the bottom of the aperture 46. At this time, since the CoSi$_2$ layer 44 is covered with the silicon nitride film 45, it is possible to prevent aggregation of CoSi$_2$ which forms the CoSi$_2$ layer 44 caused by the heat during formation of the TiSi$_2$ layer 47. Therefore, a low resistance condition of the CoSi$_2$ layer 44 can be maintained. With the process up to this point, in the SBD formation region, a Schottky-barrier diode can be formed where the CoSi$_2$ layer 44 connected to the n$^+$ type semiconductor region 42 is assumed to be the cathode electrode (first electrode) and the TiSi$_2$ layer 47 connected to the n-well 34 is assumed to be the anode electrode (Schottky electrode (second electrode)).

In this embodiment, the aforementioned TiSi$_2$ layer 47 is formed only for the anode electrode (Schottky electrode) of the Schottky-barrier diode. Therefore, the TiSi$_2$ layer 47 is preferably formed of a TiSi$_2$ layer of C49 phase which can be formed at a low temperature even if there is relatively high resistance. As a result, since heat during the formation of the TiSi$_2$ layer 47 can be prevented from influencing other components, it is possible to prevent CoSi$_2$ which forms the CoSi$_2$ layer 44 from agglomerating due to heat during formation of the TiSi$_2$ layer 47 and to prevent the properties of the n-channel type MISFET and the Schottky-barrier diode from changing.

Although the silicon oxide film 43 is used as a mask when the CoSi$_2$ layer 44 is formed in this embodiment, when silicon nitride film is used instead of the silicon oxide film 43, it has a higher relative permittivity than the silicon oxide film 43, thereby, the permittivity increases caused by the remaining silicon nitride film and there is a potential of causing defects such as interconnection delays, etc. Specifically, as in this embodiment, it is preferable to use the silicon oxide film 43 as a mask when the CoSi$_2$ layer 44 is formed.

According to this embodiment, a manufacturing process of a Schottky-barrier diode where the TiSi$_2$ layer 47 is processed to be an anode electrode (Schottky electrode) can be easily incorporated into a manufacturing process of the n-channel type MISFETQn where the CoSi$_2$ layer 44 is formed over the n$^+$ type semiconductor region 42 (source and drain) and the gate electrode 38. Moreover, in the Schottky-barrier diode formed as in this embodiment, since the anode electrode (Schottky electrode) can be formed of the TiSi$_2$ layer 47, the Schottky-barrier diode can be operated with a physically lower forward voltage than the case when the anode electrode (Schottky electrode) is formed of the CoSi$_2$ layer, so that the properties of the Schottky-barrier diode can be relatively improved.

Moreover, since leakage is easily generated when a reverse voltage is applied, a means, etc. to prevent the leakage by preparing a guard-ring is utilized in the Schottky-barrier diode where the anode electrode (Schottky electrode) is formed of the CoSi$_2$ layer. Therefore, the parasitic capacitance in this guard-ring increases and it brings an increase in the impedance, so that there is a potential of causing defects where the properties of the Schottky-barrier diode are deteriorated. On the other hand, since leakage is not relatively generated easily in a Schottky-barrier diode of this embodiment where the anode electrode (Schottky electrode) is formed of the TiSi$_2$ layer 47, the guard-ring can be omitted. As a result, an increase in the parasitic capacitance is prevented and an increase in the impedance can be suppressed, so that a decrease in the properties of the Schottky-barrier diode can be provided.

In the aforementioned embodiment, the TiSi$_2$ layer 47 which becomes the anode electrode (Schottky electrode) of the Schottky-barrier diode is formed thicker than the CoSi$_2$ layer 44 which is formed corresponding to the properties of the n-channel type MISFETQn. Therefore, even if the TiSi$_2$ layer 47 is shaved when the contact hole reaching the TiSi$_2$ layer 47 is formed in the interlayer insulating film deposited over the substrate 31 in the following step, a desired thickness can even be secured. As a result, generation of leakage can be prevented when a reverse voltage is applied to the Schottky-barrier diode of this embodiment.

Next, the unreacted Ti film is removed by wet-etching. Therefore, even in the part where a step is created by forming the gate electrode 38 and the part when a local overhang is created, the Ti film can be removed with certainty. Thus, by surely removing the unreacted Ti film, defects can be prevented where manufacturing failures arise in the contact hole caused by the Ti film remaining at the contact hole processing part when the contact hole is formed by the SAC processing in the following process. Moreover, since the unreacted Ti film is removed by wet-etching, the amount of the shaved underlayer silicon nitride film 45 can be minimized.

Figure 19:
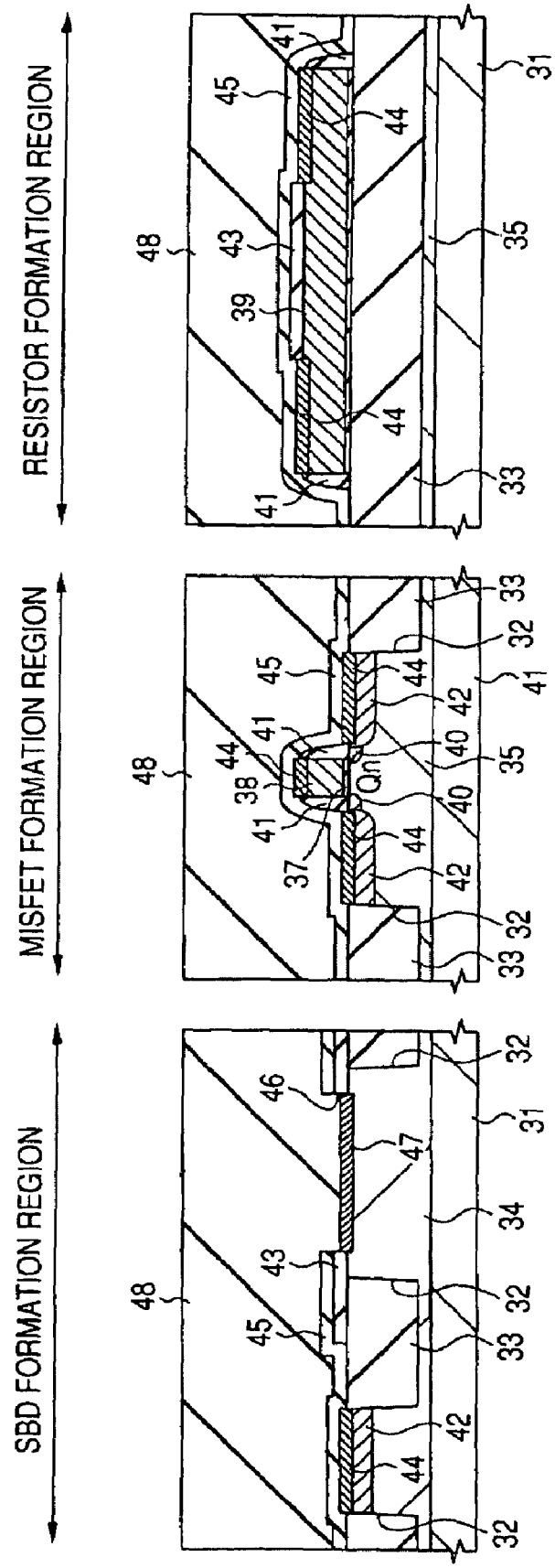
FIG. 19 is a cross-sectional view of the main parts in a manufacturing process of a chip following FIG. 18.

Next, as shown in FIG. 19, a silicon oxide layer which does not include a conductive impurity, such as P, etc. is deposited by using a CVD technique over the TiSi$_2$ layer 47 and the silicon nitride film 45. Next, the surface of the silicon oxide film is planarized by, for instance, a CMP technique to form an interlayer insulating film (first insulation film) 48. Since the interlayer insulating film 48 contacts the TiSi$_2$ layer 47 at the bottom of the aperture 46, when a PSG (Phospho Silicate Glass) film or a BPSG (Boro-Phospho Silicate Glass) film which is a silicon oxide system film including P (phosphorus) are used as the interlayer insulating film 48, there is a potential of a decrease in the properties of the Schottky-barrier diode by diffusing conductive impurities from the interpoly dipole film 48 to the TiSi$_2$ layer 47 and the n-type well 34. On the other hand, in this embodiment, such a defect can be prevented since a silicon oxide film which does not include a conductive impurity such as P (phosphorus), etc. is used as an interlayer insulating film 48.

In this embodiment, when a silicon oxide film to be an interlayer insulating film 48 is deposited, the step created at the surface of the silicon oxide can be made about the film thickness (from 20 nm to 60 nm) of the underlayer thin silicon nitride film 45. As a result, the surface of the silicon oxide film can be easily planarized. It is possible to avoid breakage of the interconnection formed over the interlayer insulating film 48 by planarizing the surface of the interlayer insulating film 48.

Figure 20:
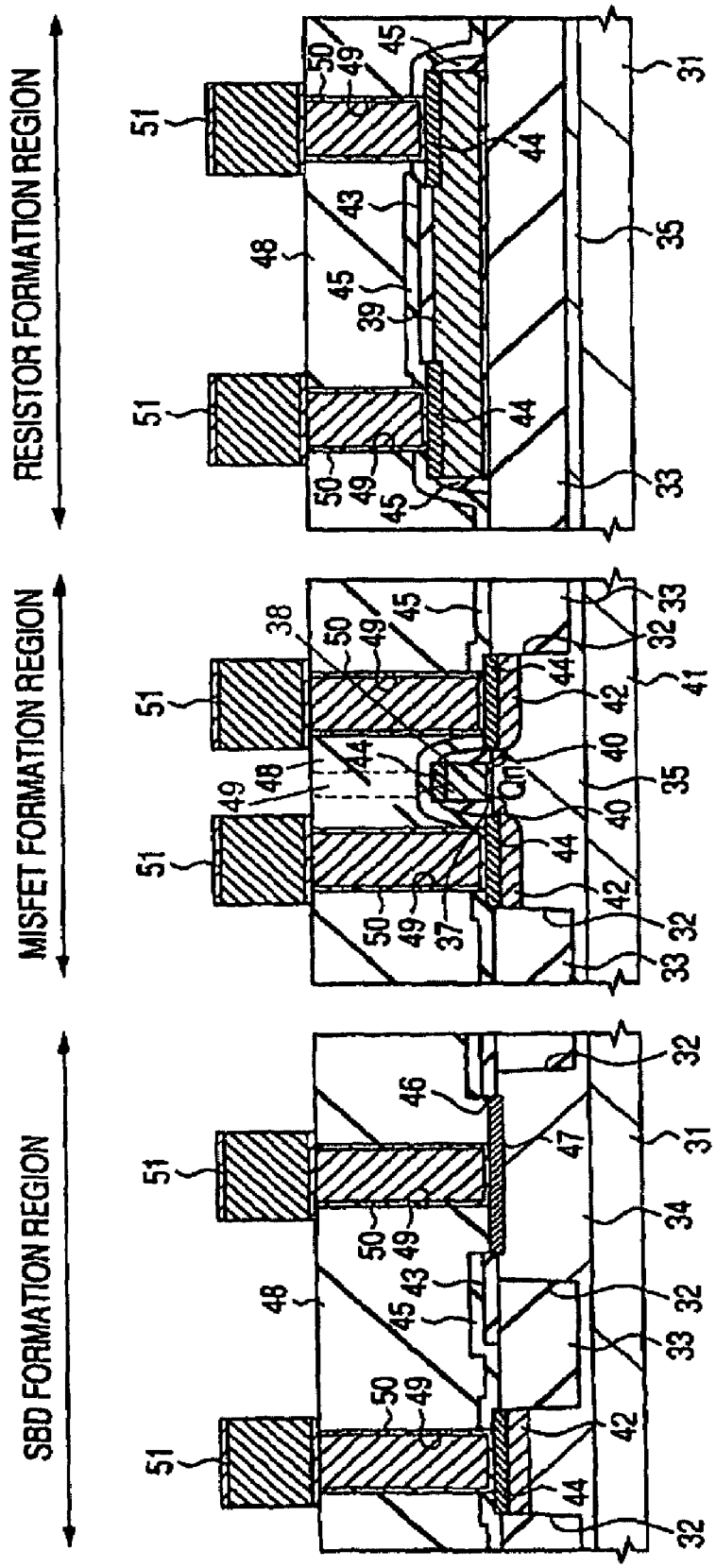
FIG. 20 is a cross-sectional view of the main parts in a manufacturing process of a chip following FIG. 19.

Next, as shown in FIG. 20, an aperture is formed by patterning the interlayer insulating film 48 using an etching technique which uses a photoresist film as a mask. Next, contact holes (second aperture, third aperture, fourth aperture, fifth aperture, and sixth aperture) 49 reaching the CoSi$_2$ layer 44 over the n$^+$ type semiconductor region, the CoSi$_2$ layer 44 over the resistor 39, the CoSi$_2$ layer 44 which is the cathode electrode of the Schottky-barrier diode, and the TiSi$_2$ layer 47 which is the anode electrode (Schottky electrode) of the Schottky barrier diode, respectively, are formed by etching the silicon nitride film 45 which appears at the bottom of the aperture. Additionally, in a region outside the plane of FIG. 20, a contact hole 49 reaching the CoSi$_2$ layer 44 over the gate electrode 38 is also formed, as indicated by dashed lines in the figure. In this embodiment, these contact holes 49 can be formed with almost the same aperture diameter.

In this embodiment, the silicon nitride film 45 can be used as an etching stopper while etching the interlayer insulating film 48 when the contact hole 49 is formed. Specifically, the manufacturing steps of a semiconductor device of this embodiment can be reduced without separately installing the silicon nitride film for the etching stopper.

Moreover, in this embodiment, the silicon oxide film 43 is used as a mask when the CoSi$_2$ layer 44 is formed. In the case when the silicon nitride film is used instead of the silicon oxide film 43 as a mask, since the silicon nitride has a higher relative permittivity than the silicon oxide, the impedance of the circuit formed in the semiconductor device of the embodiment increases due to the silicon nitride film remaining after the formation of the CoSi$_2$ layer 44, thereby, there is a potential of causing malfunctions where the operation speed of the circuit is made lower. Moreover, in the case when the silicon nitride film is used instead of the silicon oxide film 43 as a mask while forming the CoSi$_2$ layer 44 and the silicon oxide film is used as a mask instead of the silicon nitride film 45 while forming the TiSi$_2$ layer 47, it is necessary to install a silicon nitride film independently on the substrate 31 as an etching stopper. When such a silicon nitride film used for an etching stopper is installed independently, the impedance of the circuit not only increases, but the silicon film also remains at the bottom of the contact hole 49 after forming the contact hole 49. As a result, an inconvenience is created, in which the manufacturing steps are increased for removing the silicon oxide film at the bottom of the contact hole 49.

On the other hand, in this embodiment, an increase in the impedance of the circuit can be controlled by using the silicon oxide film 43 as a mask while forming the CoSi$_2$ layer 44. Moreover, in the region where the contact hole 49 is formed, the silicon oxide film 43 is completely removed below the silicon nitride film 45. As a result, since the defects of the silicon oxide film 43 remaining at the bottom of the contact hole 49 after forming the contact hole can be prevented, an increase in the manufacturing steps of the semiconductor device in this embodiment is avoided and the contact hole 49 can be formed easily.

Next, by using a sputtering technique for instance, a roughly 10 nm thick Ti film and an approximately 50 nm thick TiN film are deposited, in order, as barrier films over the interlayer insulating film 48 which includes the inside of the contact hole 49, and a heat treatment is applied thereto at a temperature from 500° C. to 700° C. for one minute. Next, by using a CVD technique for instance, a W film is deposited as a conductive film over the interlayer insulating film 48 and the barrier film, and the contact hole 49 is buried with the W film. Next, by using an etching technique or a CMP technique, the W film, TiN film, and the Ti film over the interlayer insulating film 48 are removed, and the W film, TiN film, and Ti film remain inside of the contact hole 49. As a result, a plug 50, where the TiN film and the Ti film are used for the barrier film and the W film is used for the main conductive layer, is formed in the contact hole 49.

Next, a Ti film, an Al (aluminum) film, and a titanium nitride film are deposited, in order from the lower layer, as a conductive layer over the interlayer insulating film 48. These Ti film, Al film, and titanium nitride film are patterned by a dry etching technique using the photoresist film as a mask to form the interconnection 51 which is connected to the plug 49.

Figure 21:
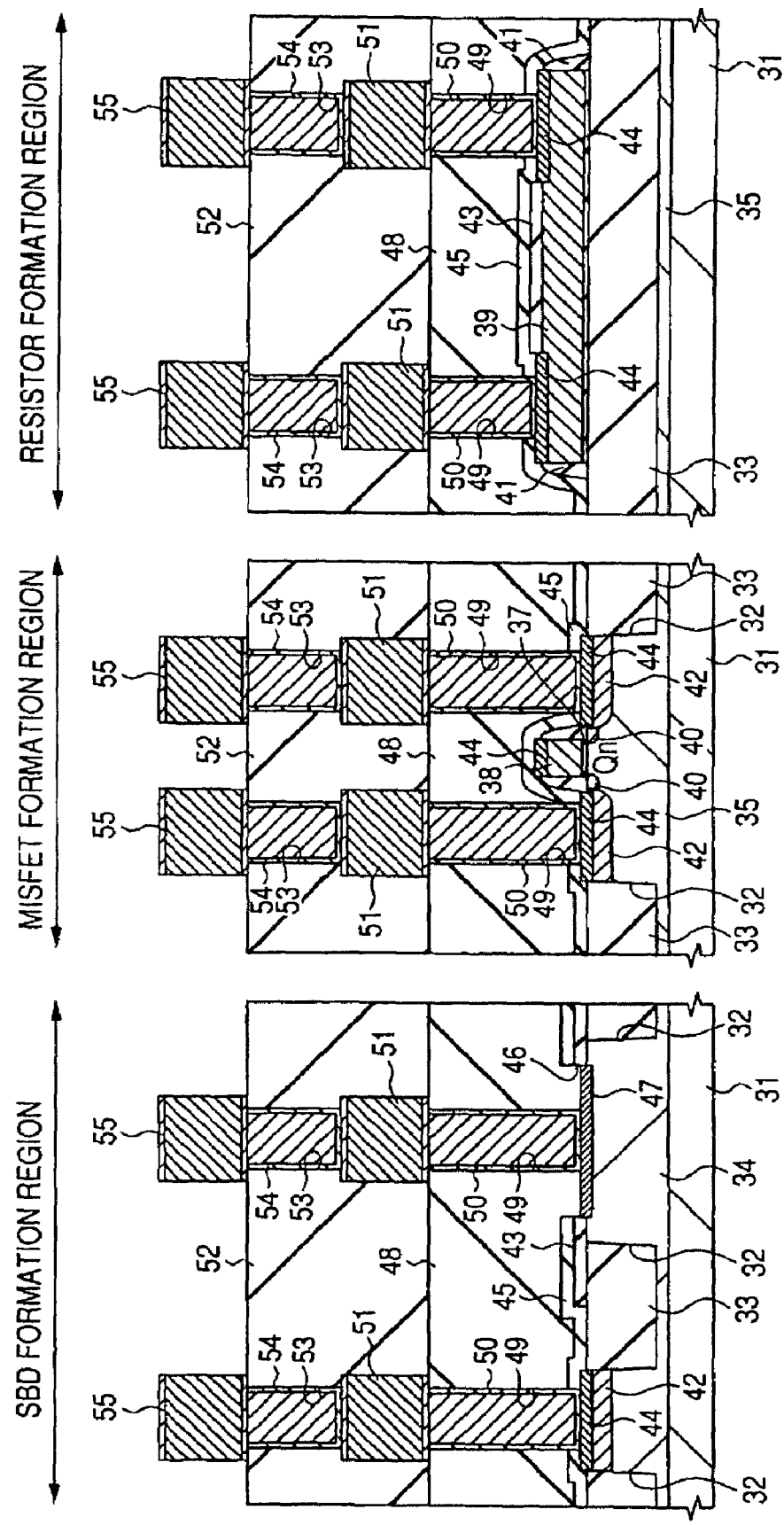
FIG. 21 is a cross-sectional view of the main parts in a manufacturing process of a chip following FIG. 20.

Next, as shown in FIG. 21, the interlayer insulating film 52 is formed by depositing a silicon oxide film over the substrate 31 by using, for instance, a plasma CVD technique. Next, the interlayer insulating film 52 is etched using the photoresist film, which is patterned by a photolithography technique, as a mask, resulting in the contact hole 53 being formed which reaches the interconnection 51.

Next, the plug 54 is formed inside of the contact hole 53. This plug 54 can be formed by, for instance, a step similar to the step for forming the above-mentioned plug 50.

A semiconductor device of this embodiment is manufactured by forming the interconnection 55 connected to the plug 54 over the interlayer insulating film 52. This interconnection 55 can be formed by, for instance, a process similar to the process for forming the above-mentioned interconnection 51. Moreover, the multilayer interconnection may be formed by repeating a step similar to the steps for forming the interlayer insulating film 52, the plug 54, and the interconnection 55, and the uppermost interconnection will be the uppermost metallic interconnection 22 and the metal layer 24 as mentioned above referring to FIG. 9 and FIG. 10.

Second Embodiment

In the aforementioned first embodiment, the first electrode is formed of a CoSi$_2$ layer and the second electrode is formed of a TiSi$_2$ layer. On the other hand, in this embodiment, the first electrode and the second electrode are formed of TiSi$_2$ layer. Moreover, the same as the aforementioned first embodiment, a high density n$^+$ type semiconductor region (first semiconductor region and second semiconductor region) 42 is selectively formed at the cathode formation part of the Schottky-barrier diode in the SBD formation region, and the first electrode is used for the cathode electrode of the Schottky-barrier diode and the second electrode is used for the anode electrode of the Schottky-barrier diode.

The reason to form the first electrode like this in this embodiment is as follows; it is necessary to take the distance between the first electrode and the second electrode on the larger side, because the alignment allowance between the isolation part 32 and the boundary of the mask used when the silicon oxide film 43 shown in FIG. 16 and the silicon nitride film 45 shown in FIG. 17 are selectively removed should be considered, if the first electrode is formed of CoSi$_2$ and the second electrode is formed of TiSi$_2$.

In this embodiment, since the border of the mask is not necessary to be provided between the first electrode and the second electrode, the distance between the first electrode and the second electrode can be made smaller. Therefore, the area of the Schottky-barrier diode formation region can be reduced, as a result miniaturization of the chip 5 can be designed.

Moreover, in the manufacturing method of this embodiment, the manufacturing method and the effects are similar to the aforementioned first embodiment with the exception that a TiSi$_2$ layer is formed instead of a CoSi$_2$ layer 44, so that the description will be omitted.

The present invention is not intended to be limited to the aforementioned embodiments though the invention developed by the inventors has been described with reference to the embodiments, and variations may be made by one skilled in the art without departing from the spirit and scope of the invention.

A manufacturing method of a semiconductor device of the present invention can be applied to a semiconductor device which has a Schottky-barrier diode and other semiconductor elements in the same chip and a manufacturing process thereof.

What is claimed is:

1. A semiconductor device comprising:
   a MISFET including a source region and a drain region formed in a first region over the main surface of a semiconductor substrate which includes silicon as a main component, and the MISFET further including a gate electrode which includes silicon as a main component; and
   a Schottky-barrier diode including a first electrode and a second electrode formed in a second region over said main surface of said semiconductor substrate,
   wherein, a first metallic compound layer which includes silicon and a first metal is formed over the surface of said source region, said drain region, and said gate electrode, wherein said first electrode is formed with said first metallic compound layer, wherein said second electrode has a second metallic compound layer which includes silicon and a second metal, and wherein said second metallic compound layer has a lower Schottky-barrier than would said second electrode with said first metallic compound layer.

2. A semiconductor device according to claim 1, wherein the thickness of said second metallic compound layer is greater than the thickness of said first metallic compound layer.

3. A semiconductor device according to claim 1,
wherein said first metal includes cobalt as a main component, and
wherein said second metal includes titanium as a main component.

4. A semiconductor device according to claim 3,
wherein the thickness of said first metallic compound layer is from 20 nm to 40 nm, and
wherein the thickness of said second metallic compound layer is from 50 nm to 70 nm.

5. A semiconductor device according to claim 3, wherein said second metallic compound layer includes a TiSi$_2$ layer of C49 phase.

6. A semiconductor device according to claim 1,
wherein said first electrode is a cathode electrode,
wherein said second electrode is an anode electrode,
wherein said cathode electrode includes a first impurity region formed in said semiconductor substrate of said second region, below said first metallic compound layer,
wherein said anode electrode includes a second impurity region formed in said semiconductor substrate of said second region, below said second metallic compound layer, and
wherein each of an impurity density of said source region, an impurity density of said drain region, and an impurity density of said first impurity region is greater than an impurity density of said second impurity region.

7. A semiconductor device according to claim 1,
wherein a first insulation film that does not include any conductive impurities is formed over said MISFET and said Schottky-barrier diode, and
wherein a portion of said second electrode contacts said first insulation film.

8. A semiconductor device according to claim 7, further comprising:
a first aperture which reaches said first metallic compound layer over one of said source region and said drain region;
a second aperture which reaches said first metallic compound layer over said gate electrode;
a third aperture which reaches said first electrode;
a fourth aperture which reaches said first electrode; and
plugs formed inside of said first aperture, said second aperture, said third aperture, and said fourth aperture,
wherein said first aperture, said second aperture, said third aperture, and said fourth aperture have a same opening diameter.

9. A semiconductor device comprising:
a semiconductor substrate including silicon as a main component; and
a Schottky-barrier diode including a cathode electrode and an anode electrode formed in said semiconductor substrate,
wherein said cathode electrode has a first metallic compound layer including silicon and a first metal,
wherein said anode electrode has a second metallic compound layer including silicon and a second metal, and
wherein said second metallic compound layer has a lower Schottky-barrier than would said anode electrode with said first metallic compound layer.

10. A semiconductor device according to claim 9, wherein the thickness of said second metallic compound layer is greater than the thickness of said first metallic compound layer.

11. A semiconductor device according to claim 9,
wherein said first metal includes cobalt as a main component, and
wherein said second metal includes titanium as a main component.

12. A semiconductor device according to claim 11,
wherein the thickness of said first metallic compound layer is from 20 nm to 40 nm, and
wherein the thickness of said second metallic compound layer is from 50 mm to 70 nm.

13. A semiconductor device according to claim 9,
wherein said cathode electrode further includes a first impurity region formed in said semiconductor substrate, below said first metallic compound layer,
wherein said anode electrode further includes a second impurity region formed in said semiconductor substrate, below said second metallic compound layer, and
wherein an impurity density of said first impurity region is greater than an impurity density of said second impurity region.

14. A semiconductor device comprising:
a semiconductor substrate including silicon as a main component; and
a Schottky-barrier diode including a cathode electrode and an anode electrode formed in sail semiconductor substrate,
wherein said cathode electrode has a first metallic compound layer including silicon and a first metal,
wherein said anode electrode has a second metallic compound layer including silicon and a second metal, and
wherein said first metal and said second metal are different.

15. A semiconductor device according to claim 14, wherein the thickness of said second metallic compound layer is greater than the thickness of said first metallic compound layer.

16. A semiconductor device according to claim 14,
wherein said first metal includes cobalt as a main component, and
wherein said second metal includes titanium as a main component.

17. A semiconductor device according to claim 16,
wherein the thickness of said first metallic compound layer is from 20 nm to 40 nm, and
wherein the thickness of said second metallic compound layer is from 50 nm to 70 nm.

18. A semiconductor device according to claim 14,
wherein said cathode electrode further includes a first impurity region formed in said semiconductor substrate, below said first metallic compound layer,
wherein said anode electrode further includes a second impurity region formed in said semiconductor substrate, below said second metallic compound layer, and
wherein an impurity density of said first impurity region is greater than an impurity density of said second impurity region.

* * * * *